United States Patent
Choi et al.

(10) Patent No.: US 10,026,478 B1
(45) Date of Patent: Jul. 17, 2018

(54) BIASING SCHEME FOR MULTI-LAYER CROSS-POINT RERAM

(71) Applicant: SANDISK TECHNOLOGIES LLC, Plano, TX (US)

(72) Inventors: Won Ho Choi, San Jose, CA (US); Jay Kumar, Saratoga, CA (US); Zvonimir Bandic, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/448,602

(22) Filed: Mar. 3, 2017

(51) Int. Cl.
  *G11C 13/00* (2006.01)

(52) U.S. Cl.
  CPC ........ *G11C 13/0097* (2013.01); *G11C 13/004* (2013.01); *G11C 13/0026* (2013.01); *G11C 13/0028* (2013.01); *G11C 13/0069* (2013.01); *G11C 2013/0042* (2013.01)

(58) Field of Classification Search
  CPC ................ G11C 13/004; G11C 2013/0042
  USPC ............................................. 365/148
  See application file for complete search history.

(56) References Cited

U.S. PATENT DOCUMENTS

| | | | |
|---|---|---|---|
| 8,144,494 B2 | 3/2012 | Takase | |
| 8,576,651 B2 | 11/2013 | Scheuerlein | |
| 2014/0258646 A1 | 9/2014 | Goss | |
| 2014/0347912 A1* | 11/2014 | Siau | G11C 7/062 |
| | | | 365/148 |

OTHER PUBLICATIONS

US 8,446,782, 05/2013, Nagashima (withdrawn)

\* cited by examiner

*Primary Examiner* — Jason Lappas
(74) *Attorney, Agent, or Firm* — Vierra Magen Marcus LLP

(57) ABSTRACT

Systems and methods for improving the performance of a non-volatile memory array during a memory operation by concurrently applying two different selected word line voltages to two different word lines within the non-volatile memory array are described. The memory operation may comprise a write operation or a combination of SET and RESET operations. The memory array may include a first word line connected to a first set of memory cells, a second word line connected to a second set of memory cells, and a third word line connected to a third set of memory cells. During the memory operation, the first word line may be set to a first selected word line voltage (e.g., 3V), the second word line may be set to a second selected word line voltage (e.g., 0V), and the third word line may be set to an unselected word line voltage (e.g., 1.5V).

25 Claims, 17 Drawing Sheets

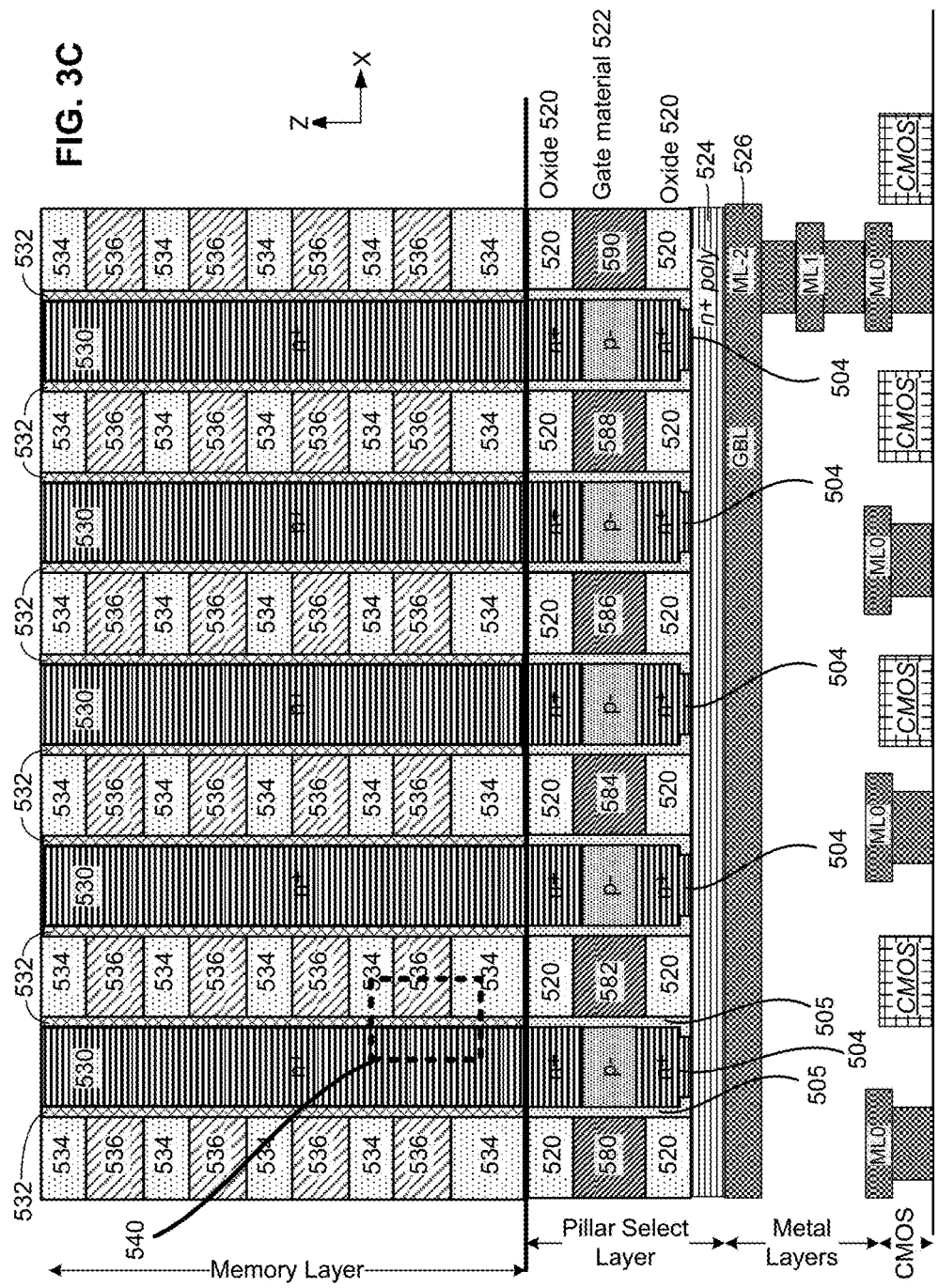

BIASING SCHEME FOR MULTI-LAYER CROSS-POINT RERAM

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may comprise non-volatile memory or volatile memory. A non-volatile memory device allows information to be stored or retained even when the non-volatile memory device is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PRAM). In recent years, non-volatile memory devices have been scaled in order to reduce the cost per bit. However, as process geometries shrink, many design and process challenges are presented. These challenges include increased variability in transistor characteristics and memory element characteristics over process, voltage, and temperature variations.

BRIEF DESCRIPTION OF THE DRAWINGS

FIGS. 3A-3C depict various embodiments of a portion of a three-dimensional memory array.

DETAILED DESCRIPTION

Figure 1A:
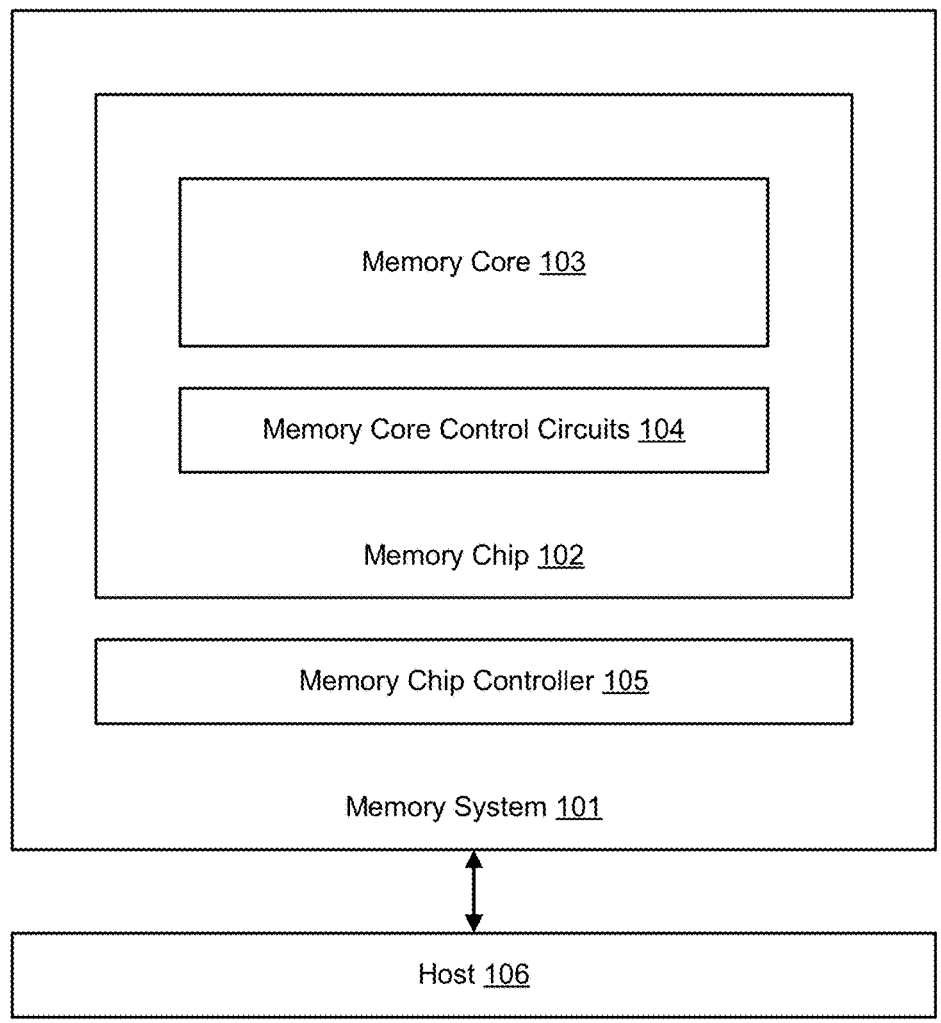
FIGS. 1A-1E depict various embodiments of a memory system.

Technology is described for improving the performance of a non-volatile memory array by concurrently applying two different selected word line voltages to two different word lines within the non-volatile memory array during a memory operation. The memory operation may comprise a multi-bit write operation or a combination of SET and RESET operations. The memory array may include a first word line connected to a first set of memory cells, a second word line connected to a second set of memory cells, and a third word line connected to a third set of memory cells. During the memory operation, the first word line may be set to a first selected word line voltage (e.g., 3V), the second word line may be set to a second selected word line voltage (e.g., 0V) different from the first selected word line voltage, and the third word line may be set to an unselected word line voltage (e.g., 1.5V). The first selected word line voltage, and the third word line may be set to an unselected may be between the first selected word line voltage and the second selected word line voltage. During the memory operation, a first bit line connected to a first memory cell of the first set of memory cells may be set to a first selected bit line voltage (e.g., 0V), a second bit line connected to a second memory cell of the second set of memory cells may be set to a second selected bit line voltage (e.g., 3V), and a third bit line connected to a third memory cell of the third set of memory cells may be set to an unselected bit line voltage (e.g., 1.5V). In this case, during the memory operation, a positive voltage (e.g., +3V) substantially equal to the first selected word line voltage minus the first selected bit line voltage may be placed across the first memory cell causing the first memory cell to be RESET (or SET), a negative voltage (e.g., −3V) substantially equal to the second selected word line voltage minus the second selected bit line voltage may be placed across the second memory cell causing the second memory cell to be SET (or RESET), and 0V or a voltage substantially equal to the unselected word line voltage minus the unselected bit line voltage may be placed across the third memory cell causing the third memory cell to remain in its current state.

One benefit of using the first word line/first bit line pair to RESET the first memory cell while the second word line/second bit line pair is used to SET the second memory cell is that the programming currents flowing through the first memory cell and the second memory cell take separate paths. Therefore, any IR drops along the first word line and the first bit line due to the programming current through the first memory cell will not affect the IR drops along the second word line and the second bit line. Another benefit of concurrently setting and resetting memory cells on two different word lines by concurrently applying two different selected word line voltages to the two different word lines is that the programming throughput may be improved.

In one embodiment, a memory array may comprise two layers of memory cells with a second layer arranged above a first layer. A first word line may connect to a first set of memory cells within the first layer of the two layers of memory cells and a second word line may connect to a second set of memory cells within the second layer of the two layers of memory cells. In one example, a first memory cell of the first set of memory cells may be SET while a second memory cell of the second set of memory cells is RESET via the application of a first selected word line voltage being applied to the first word line and a second selected word line voltage being applied to the second word line.

In some cases, the first word line may be set to the first selected word line voltage via application of a first voltage pulse of a first pulse width and a first magnitude and the second word line may be set to a second selected word line voltage via application of a second voltage pulse of a second pulse width different from the first pulse width and/or a second magnitude different from the first magnitude. In one example, the first voltage pulse may transition from 0V to 3V, remain at 3V for 100 ns, and then transition from 3V back to 0V. The determination of the first pulse width and the first magnitude of the first voltage pulse may be made based on the type of memory operation to be performed (e.g., whether a SET or RESET operation is to be performed) and/or a temperature of the memory die. In one example, the first pulse width may be 100 ns for a SET operation and 50 ns for a RESET operation. In another example, the first pulse width may be 200 ns if the chip temperature is over 85 degrees Celsius and 150 ns if the chip temperature is less than 85 degrees Celsius. The determination of the first pulse width and the first magnitude of the first voltage pulse may be made prior to performing the memory operation (e.g., during wafer sort, during packaging, prior to shipment of the memory die, or in the field on a periodic basis). In one example, the determination of the first pulse width and the first magnitude of the first voltage pulse may be made on a periodic bases after a threshold number of memory operation have been performed. Similarly, the determination of the second pulse width and the second magnitude of the second voltage pulse may be made based on the type of memory operation to be performed (e.g., whether a SET or RESET operation is to be performed) and/or a temperature of the memory die. The determination of the second pulse width and the second magnitude of the second voltage pulse may be made prior to performing the memory operation and may be made on a periodic bases after a threshold number of memory operation have been performed.

The non-volatile memory array may comprise a two-dimensional array of non-volatile memory cells. The memory cells within a two-dimensional memory array may form a single layer of memory cells and may be selected via control lines (e.g., word lines and bit lines) in the X and Y directions. The non-volatile memory array may comprise a monolithic three-dimensional memory array in which two or more layers of memory cells may be formed above a single substrate without any intervening substrates. In some cases, a three-dimensional memory array may include one or more vertical columns of memory cells located above and orthogonal to a substrate or substantially orthogonal to the substrate (e.g., within 2-5 degrees of a normal vector that is orthogonal to the substrate). In one example, a non-volatile storage system may include a memory array with vertical bit lines or bit lines that are arranged orthogonal to a semiconductor substrate. The substrate may comprise a silicon substrate. The memory array may include rewriteable non-volatile memory cells, wherein each memory cell includes a reversible resistance-switching element with or without an isolation element in series with the reversible resistance-switching element (e.g., no diode in series with the reversible resistance-switching element). The memory cells within the memory array may comprise ReRAM memory cells, MRAM memory cells, or phase change memory cells.

In some embodiments, a memory array may comprise a cross-point memory array. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction. The two-terminal memory cells may include a resistance-switching material, such as a phase change material, a ferroelectric material, or a metal oxide (e.g., nickel oxide or hafnium oxide). In some cases, each memory cell in a cross-point memory array may be placed in series with a steering element or an isolation element, such as a diode, in order to reduce leakage currents. In cross-point memory arrays where the memory cells do not include an isolation element, controlling and minimizing leakage currents may be a significant issue, especially since leakage currents may vary greatly over biasing voltage and temperature.

In some embodiments, a memory cell may be formed using a Vacancy Modulated Conductive Oxide (VMCO) structure. The VMCO structure may include a layer of amorphous silicon (e.g., a Si barrier layer) and a layer titanium oxide (e.g., a $TiO_2$ switching layer). In some cases, the VMCO structure (or VMCO stack) may use bulk switching or switching O-ion movements across an area of the VMCO structure, as compared with switching locally in a constriction of vacancy formed filamentary path. In some embodiments, VMCO structures may be partially or fully embedded within word line layers of a memory array, such as a memory array arranged using a vertical bit line (VBL) architecture (e.g., a memory array architecture in which memory cells are arranged between horizontal word lines and vertical bit lines that are orthogonal to a substrate). A VMCO structure may be partially or fully formed within a word line layer of a memory array. A VMCO stack may comprise a layer of amorphous silicon and a layer titanium oxide. In some cases, the VMCO stack may comprise a layer of thin aluminum oxide or other metal oxides arranged between the layer of amorphous silicon and the layer titanium oxide.

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading and/or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

In one embodiment, the memory cells within a memory array may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) memory cells. In other cases, the re-writeable non-volatile memory cells may comprise conductive bridge memory cells or programmable metallization memory cells.

FIG. 1A depicts one embodiment of a memory system 101 and a host 106. The memory system 101 may comprise a non-volatile storage system interfacing with the host (e.g., a mobile computing device or a server). In some cases, the memory system 101 may be embedded within the host 106. As examples, the memory system 101 may comprise a memory card, a solid-state drive (SSD) such a high density MLC SSD (e.g., 2-bits/cell or 3-bits/cell) or a high performance SLC SSD, or a hybrid HDD/SSD drive. As depicted, the memory system 101 includes a memory chip controller 105 and a memory chip 102. The memory chip 102 may include volatile memory and/or non-volatile memory. Although a single memory chip is depicted, the memory system 101 may include more than one memory chip (e.g., four or eight memory chips). The memory chip controller 105 may receive data and commands from host 106 and provide memory chip data to host 106. The memory chip controller 105 may include one or more state machines, page registers, SRAM, and control circuitry for controlling the operation of memory chip 102. The one or more state machines, page registers, SRAM, and control circuitry for controlling the operation of the memory chip may be referred to as managing or control circuits. The managing or control circuits may facilitate one or more memory array operations including forming, erasing, programming, or reading operations.

In some embodiments, the managing or control circuits (or a portion of the managing or control circuits) for facilitating one or more memory array operations may be integrated within the memory chip 102. The memory chip controller 105 and memory chip 102 may be arranged on a single integrated circuit or arranged on a single die. In other embodiments, the memory chip controller 105 and memory chip 102 may be arranged on different integrated circuits. In some cases, the memory chip controller 105 and memory chip 102 may be integrated on a system board, logic board, or a PCB.

The memory chip 102 includes memory core control circuits 104 and a memory core 103. Memory core control circuits 104 may include logic for controlling the selection of memory blocks (or arrays) within memory core 103, controlling the generation of voltage references for biasing a particular memory array into a read or write state, and generating row and column addresses. The memory core 103 may include one or more two-dimensional arrays of memory cells or one or more three-dimensional arrays of memory cells. In one embodiment, the memory core control circuits 104 and memory core 103 may be arranged on a single integrated circuit. In other embodiments, the memory core control circuits 104 (or a portion of the memory core control circuits) and memory core 103 may be arranged on different integrated circuits.

Referring to FIG. 1A, a memory operation may be initiated when host 106 sends instructions to memory chip controller 105 indicating that it would like to read data from memory system 101 or write data to memory system 101. In the event of a write (or programming) operation, host 106 may send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors are corrected by circuitry within memory chip controller 105.

Referring to FIG. 1A, the operation of memory chip 102 may be controlled by memory chip controller 105. In one example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data associated with the data to be read or a redirection pointer to a new memory location within memory chip 102 in which to read the data requested. Once a read or write operation is initiated by memory chip controller 105, memory core control circuits 104 may generate the appropriate bias voltages for word lines and bit lines within memory core 103, as well as generate the appropriate memory block, row, and column addresses.

In some embodiments, one or more managing or control circuits may be used for controlling the operation of a memory array within the memory core 103. The one or more managing or control circuits may provide control signals to a memory array in order to perform a read operation and/or a write operation on the memory array. In one example, the one or more managing or control circuits may include any one of or a combination of control circuitry, state machines, decoders, sense amplifiers, read/write circuits, and/or controllers. The one or more managing circuits may perform or facilitate one or more memory array operations including erasing, programming, or reading operations. In one example, one or more managing circuits may comprise an on-chip memory controller for determining row and column address, word line and bit line addresses, memory array enable signals, and data latching signals.

Figure 1B:
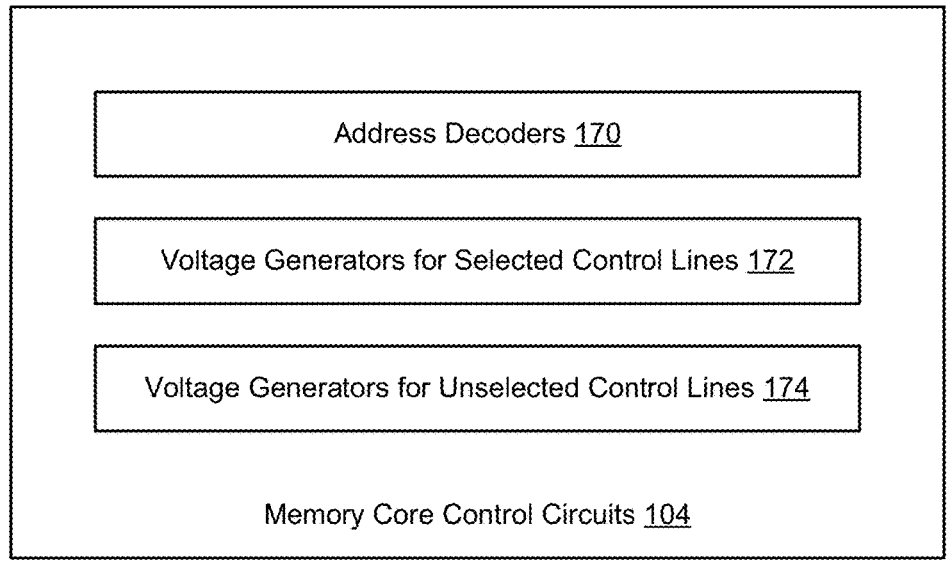

FIG. 1B depicts one embodiment of memory core control circuits 104. As depicted, the memory core control circuits 104 include address decoders 170, voltage generators for selected control lines 172, and voltage generators for unselected control lines 174. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may comprise one or more voltage generators for generating selected control line voltages. The voltage generators for unselected control lines 174 may comprise one or more voltage generators for generating unselected control line voltages. Address decoders 170 may generate memory block addresses, as well as row addresses and column addresses for a particular memory block.

Figure 1C:
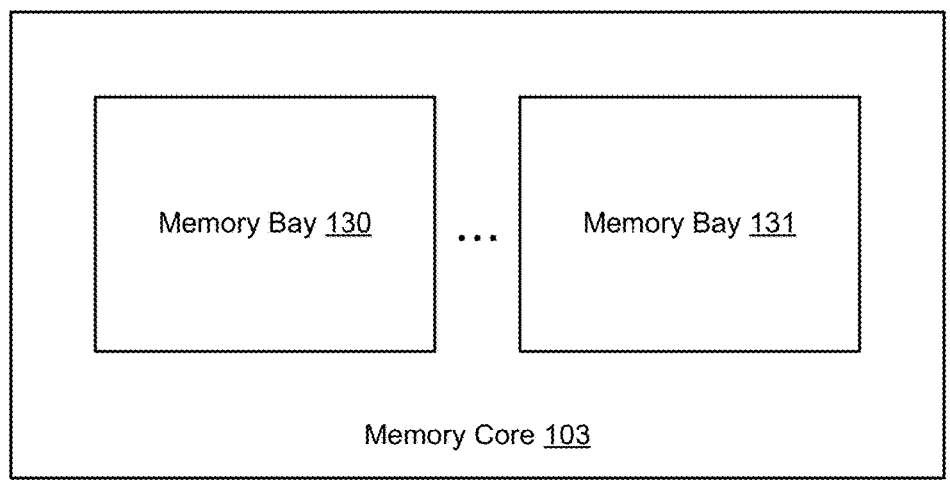
Figure 1D:
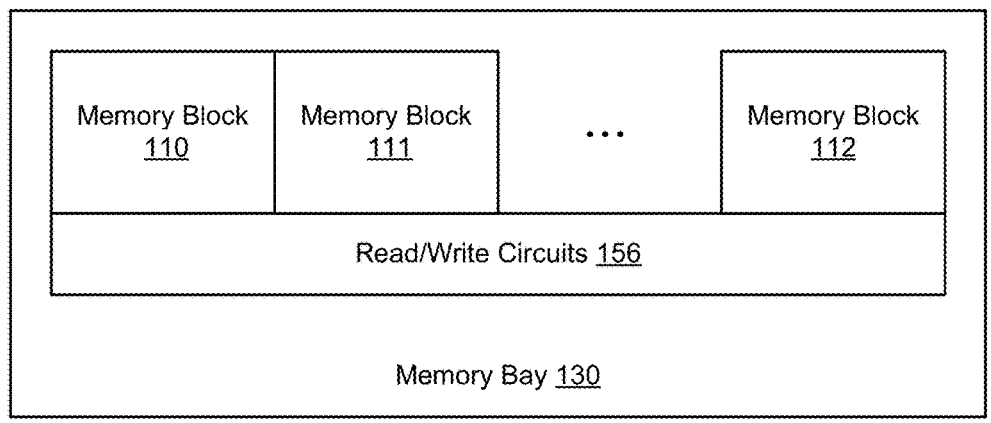
Figure 1E:
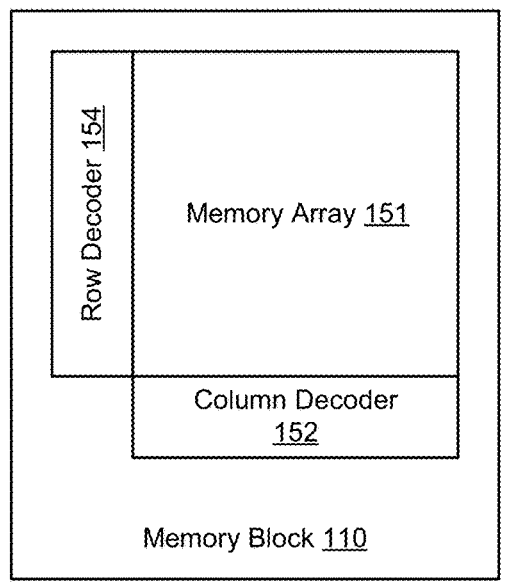

FIGS. 1C-1E depict one embodiment of a memory core organization that includes a memory core having multiple memory bays, and each memory bay having multiple memory blocks. Although a memory core organization is disclosed where memory bays comprise memory blocks, and memory blocks comprise a group of memory cells, other organizations or groupings can also be used with the technology described herein.

FIG. 1C depicts one embodiment of memory core 103 in FIG. 1A. As depicted, memory core 103 includes memory bay 130 and memory bay 131. In some embodiments, the number of memory bays per memory core can be different for different implementations. For example, a memory core may include only a single memory bay or a plurality of memory bays (e.g., 16 memory bays or 256 memory bays).

FIG. 1D depicts one embodiment of memory bay 130 in FIG. 1C. As depicted, memory bay 130 includes memory blocks 110-112 and read/write circuits 156. In some embodiments, the number of memory blocks per memory bay may be different for different implementations. For example, a memory bay may include one or more memory blocks (e.g., 32 memory blocks per memory bay). Read/write circuits 156 include circuitry for reading and writing memory cells within memory blocks 110-112. As depicted, the read/write circuits 156 may be shared across multiple memory blocks within a memory bay. This allows chip area to be reduced since a single group of read/write circuits 156 may be used to support multiple memory blocks. However, in some embodiments, only a single memory block may be electrically coupled to read/write circuits 156 at a particular time to avoid signal conflicts.

In some embodiments, read/write circuits 156 may be used to write one or more pages of data into the memory blocks 110-112 (or into a subset of the memory blocks). The memory cells within the memory blocks 110-112 may permit direct over-writing of pages (i.e., data representing a page or a portion of a page may be written into the memory blocks 110-112 without requiring an erase or reset operation to be performed on the memory cells prior to writing the data). In one example, the memory system 101 in FIG. 1A may receive a write command including a target address and a set of data to be written to the target address. The memory system 101 may perform a read-before-write (RBW) operation to read the data currently stored at the target address before performing a write operation to write the set of data to the target address. The memory system 101 may then determine whether a particular memory cell may stay at its current state (i.e., the memory cell is already at the correct state), needs to be set to a "0" state, or needs to be reset to a "1" state. The memory system 101 may then write a first subset of the memory cells to the "0" state and then write a second subset of the memory cells to the "1" state. The memory cells that are already at the correct state may be skipped over, thereby improving programming speed and reducing the cumulative voltage stress applied to unselected memory cells. A particular memory cell may be set to the "1" state by applying a first voltage difference across the particular memory cell of a first polarity (e.g., +1.5V). The particular memory cell may be reset to the "0" state by applying a second voltage difference across the particular memory cell of a second polarity that is opposite to that of the first polarity (e.g., −1.5V).

In some cases, read/write circuits 156 may be used to program a particular memory cell to be in one of three or more data/resistance states (i.e., the particular memory cell may comprise a multi-level memory cell). In one example, the read/write circuits 156 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states. Applying a smaller voltage difference across the particular memory cell may cause the particular memory cell to be partially programmed or programmed at a slower rate than when applying a larger voltage difference. In another example, the read/write circuits 156 may apply a first voltage difference across the particular memory cell for a first time period (e.g., 150 ns) to program the particular memory cell into a first state of the three or more data/resistance states or apply the first voltage difference across the particular memory cell for a second time period less than the first time period (e.g., 50 ns). One or more programming pulses followed by a memory cell verification phase may be used to program the particular memory cell to be in the correct state.

FIG. 1E depicts one embodiment of memory block 110 in FIG. 1D. As depicted, memory block 110 includes a memory array 151, row decoder 154, and column decoder 152. Memory array 151 may comprise a contiguous group of memory cells having contiguous word lines and bit lines. Memory array 151 may comprise one or more layers of memory cells. Memory array 151 may comprise a two-dimensional memory array or a three-dimensional memory array. The row decoder 154 decodes a row address and selects a particular word line in memory array 151 when appropriate (e.g., when reading or writing memory cells in memory array 151). The column decoder 152 decodes a column address and selects a particular group of bit lines in memory array 151 to be electrically coupled to read/write circuits, such as read/write circuits 156 in FIG. 1D. In one embodiment, the number of word lines is 4K per memory layer, the number of bit lines is 1K per memory layer, and the number of memory layers is 4, providing a memory array 151 containing 16M memory cells.

In one embodiment, memory array 151 may comprise memory cells that are oriented in a horizontal plane that is horizontal to the supporting substrate. In another embodiment, memory array 151 may comprise memory cells that are oriented in a vertical plane that is vertical with respect to the supporting substrate (i.e., the vertical plane is perpendicular to the supporting substrate). In this case, the bit lines of memory array 151 may comprise vertical bit lines.

Figure 2A:
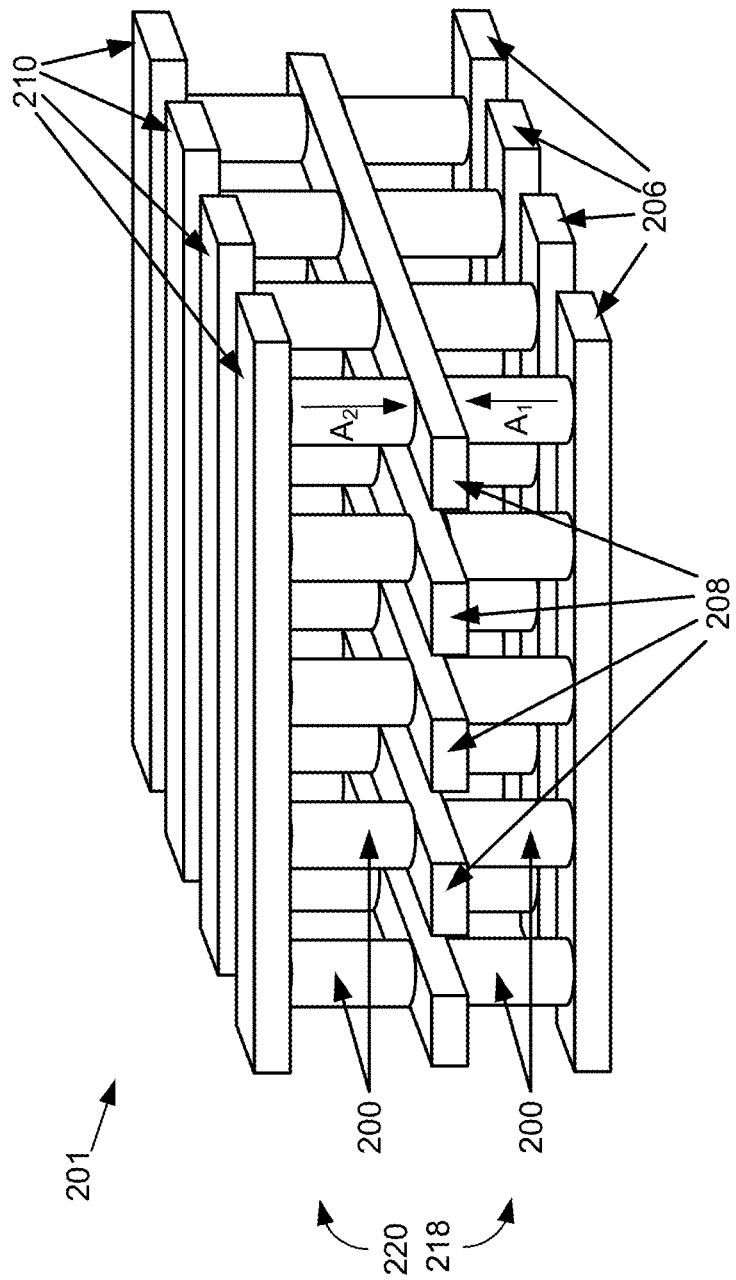
FIGS. 2A-2D depict various embodiments of a cross-point memory array.

FIG. 2A depicts one embodiment of a portion of a monolithic three-dimensional memory array 201 that includes a second memory level 220 positioned above a first memory level 218. Memory array 201 is one example of an implementation for memory array 151 in FIG. 1E. The bit lines 206 and 210 are arranged in a first direction and the word lines 208 are arranged in a second direction perpendicular to the first direction. As depicted, the upper conductors of first memory level 218 may be used as the lower conductors of the second memory level 220 that is positioned above the first memory level. In a memory array with additional layers of memory cells, there would be corresponding additional layers of bit lines and word lines.

As depicted in FIG. 2A, memory array 201 includes a plurality of memory cells 200. The memory cells 200 may include re-writeable memory cells. The memory cells 200 may include non-volatile memory cells or volatile memory cells. With respect to first memory level 218, a first portion of memory cells 200 are between and connect to bit lines 206 and word lines 208. With respect to second memory level 220, a second portion of memory cells 200 are between and connect to bit lines 210 and word lines 208. In one embodiment, each memory cell includes a steering element (e.g., a diode) and a memory element (i.e., a state change element). In one example, the diodes of the first memory level 218 may be upward pointing diodes as indicated by arrow $A_1$ (e.g., with p regions at the bottom of the diodes), while the diodes of the second memory level 220 may be downward pointing diodes as indicated by arrow $A_2$ (e.g., with n regions at the bottom of the diodes), or vice versa. In another embodiment, each memory cell includes a state change element and does not include a steering element. The absence of a diode (or other steering element) from a memory cell may reduce the process complexity and costs associated with manufacturing a memory array.

In one embodiment, the memory cells 200 of FIG. 2A may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) devices.

In another embodiment, the memory cells 200 of FIG. 2A may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Referring to FIG. 2A, in one embodiment of a read operation, the data stored in one of the plurality of memory cells 200 may be read by biasing one of the word lines (i.e., the selected word line) to a selected word line voltage in read mode (e.g., 0V). A read circuit may then be used to bias a selected bit line connected to the selected memory cell to the selected bit line voltage in read mode (e.g., 1.0V). In some cases, in order to avoid sensing leakage current from the many unselected word lines to the selected bit line, the unselected word lines may be biased to the same voltage as the selected bit lines (e.g., 1.0V). To avoid leakage current from the selected word line to the unselected bit lines, the unselected bit lines may be biased to the same voltage as the selected word line (e.g., 0V); however, biasing the unselected word lines to the same voltage as the selected bit lines and biasing the unselected bit lines to the same voltage as the selected word line may place a substantial voltage stress across the unselected memory cells driven by both the unselected word lines and the unselected bit lines.

In an alternative read biasing scheme, both the unselected word lines and the unselected bit lines may be biased to an intermediate voltage that is between the selected word line voltage and the selected bit line voltage. Applying the same voltage to both the unselected word lines and the unselected bit lines may reduce the voltage stress across the unselected memory cells driven by both the unselected word lines and the unselected bit lines; however, the reduced voltage stress comes at the expense of increased leakage currents associated with the selected word line and the selected bit line. Before the selected word line voltage has been applied to the selected word line, the selected bit line voltage may be applied to the selected bit line, and a read circuit may then sense an auto zero amount of current through the selected memory bit line which is subtracted from the bit line current in a second current sensing when the selected word line voltage is applied to the selected word line. The leakage current may be subtracted out by using the auto zero current sensing.

Referring to FIG. 2A, in one embodiment of a write operation, the reversible resistance-switching material may be in an initial high-resistivity state that is switchable to a low-resistivity state upon application of a first voltage and/or current. Application of a second voltage and/or current may return the reversible resistance-switching material back to the high-resistivity state. Alternatively, the reversible resistance-switching material may be in an initial low-resistance state that is reversibly switchable to a high-resistance state upon application of the appropriate voltage(s) and/or current(s). When used in a memory cell, one resistance state may represent a binary data "0" while another resistance state may represent a binary data "1." In some cases, a memory cell may be considered to comprise more than two data/resistance states (i.e., a multi-level memory cell). In some cases, a write operation may be similar to a read operation except with a larger voltage range placed across the selected memory cells.

The process of switching the resistance of a reversible resistance-switching element from a high-resistivity state to a low-resistivity state may be referred to as SETTING the reversible resistance-switching element. The process of switching the resistance from the low-resistivity state to the high-resistivity state may be referred to as RESETTING the reversible resistance-switching element. The high-resistivity state may be associated with binary data "1" and the low-resistivity state may be associated with binary data "0." In other embodiments, SETTING and RESETTING operations and/or the data encoding may be reversed. For example, the high-resistivity state may be associated with binary data "0" and the low-resistivity state may be associated with binary data "1." In some embodiments, a higher than normal programming voltage may be required the first time a reversible resistance-switching element is SET into the low-resistivity state as the reversible resistance-switching element may have been placed into a resistance state that is higher than the high-resistivity state when fabricated. The term "FORMING" may refer to the setting of a reversible resistance-switching element into a low-resistivity state for the first time after fabrication or the resetting of a reversible resistance-switching element into a high-resistivity state for the first time after fabrication. In some cases, after a FORMING operation or a memory cell preconditioning operation has been performed, the reversible resistance-switching element may be RESET to the high-resistivity state and then SET again to the low-resistivity state.

Referring to FIG. 2A, in one embodiment of a write operation, data may be written to one of the plurality of memory cells 200 by biasing one of the word lines (i.e., the selected word line) to the selected word line voltage in write mode (e.g., 5V). A write circuit may be used to bias the bit line connected to the selected memory cell to the selected bit line voltage in write mode (e.g., 0V). In some cases, in order to prevent program disturb of unselected memory cells sharing the selected word line, the unselected bit lines may be biased such that a first voltage difference between the selected word line voltage and the unselected bit line voltage is less than a first disturb threshold. To prevent program disturb of unselected memory cells sharing the selected bit line, the unselected word lines may be biased such that a second voltage difference between the unselected word line voltage and the selected bit line voltage is less than a second disturb threshold. The first disturb threshold and the second disturb threshold may be different depending on the amount of time in which the unselected memory cells susceptible to disturb are stressed.

In one write biasing scheme, both the unselected word lines and the unselected bit lines may be biased to an intermediate voltage that is between the selected word line voltage and the selected bit line voltage. The intermediate voltage may be generated such that a first voltage difference across unselected memory cells sharing a selected word line is greater than a second voltage difference across other unselected memory cells sharing a selected bit line. One reason for placing the larger voltage difference across the unselected memory cells sharing a selected word line is that the memory cells sharing the selected word line may be verified immediately after a write operation in order to detect a write disturb.

Figure 2B:
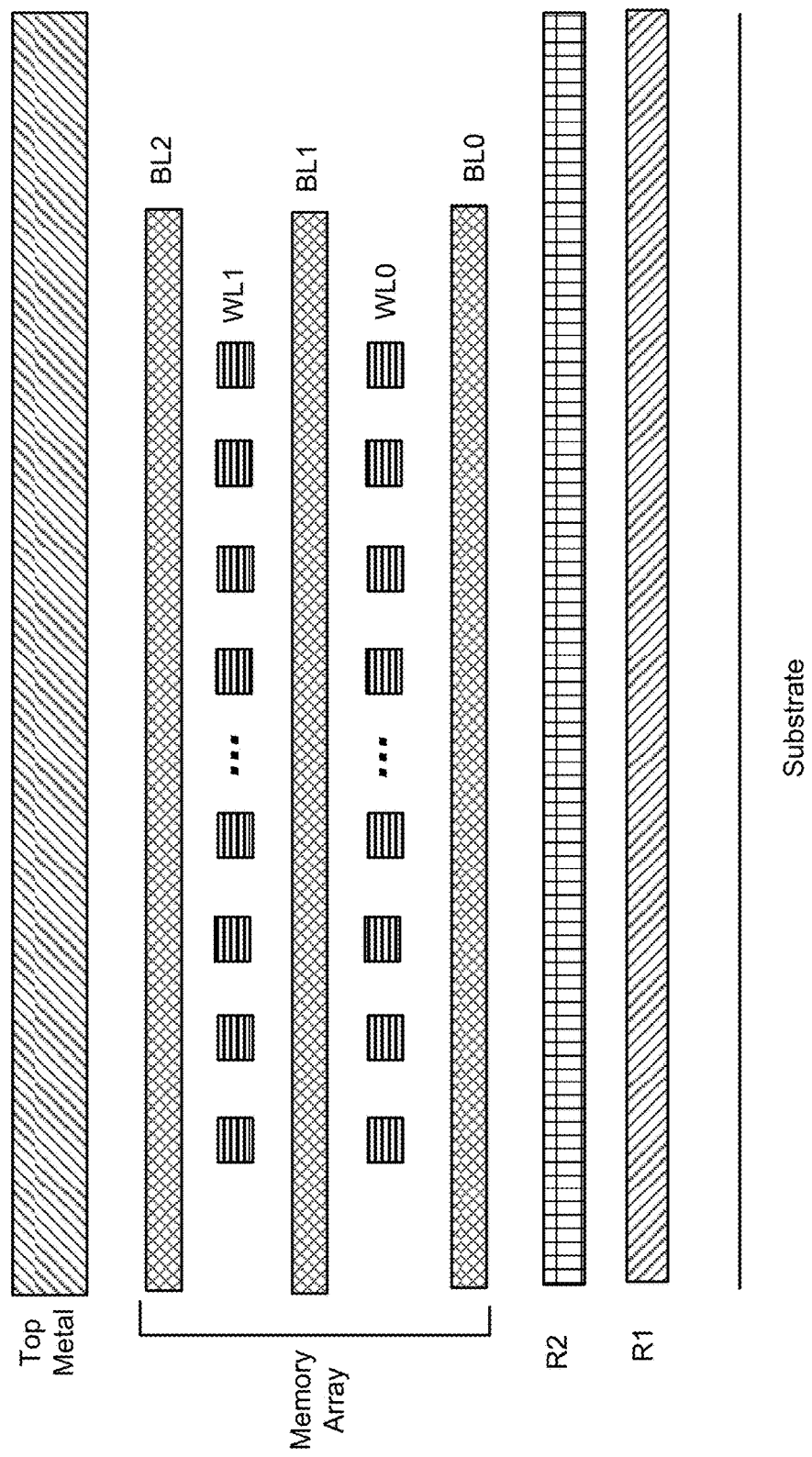

FIG. 2B depicts a subset of the memory array and routing layers of one embodiment of a three-dimensional memory array, such as memory array 151 in FIG. 1E. As depicted, the Memory Array layers are positioned above the Substrate. The Memory Array layers include bit line layers BL0, BL1 and BL2, and word line layers WL0 and WL1. In other embodiments, additional bit line and word line layers can also be implemented. Supporting circuitry (e.g., row decoders, column decoders, and read/write circuits) may be arranged on the surface of the Substrate with the Memory Array layers fabricated above the supporting circuitry. An integrated circuit implementing a three-dimensional memory array may also include multiple metal layers for routing signals between different components of the supporting circuitry, and between the supporting circuitry and the bit lines and word lines of the memory array. These routing layers can be arranged above the supporting circuitry that is implemented on the surface of the Substrate and below the Memory Array layers.

As depicted in FIG. 2B, two metal layers R1 and R2 may be used for routing layers; however, other embodiments can include more or less than two metal layers. In one example, these metal layers R1 and R2 may be formed of tungsten (about 1 ohm/square). Positioned above the Memory Array layers may be one or more top metal layers used for routing signals between different components of the integrated circuit, such as the Top Metal layer. In one example, the Top Metal layer is formed of copper or aluminum (about 0.05 ohms/square), which may provide a smaller resistance per unit area than metal layers R1 and R2. In some cases, metal layers R1 and R2 may not be implemented using the same materials as those used for the Top Metal layers because the metal used for R1 and R2 must be able to withstand the processing steps for fabricating the Memory Array layers on top of R1 and R2 (e.g., satisfying a particular thermal budget during fabrication).

Figure 2C:
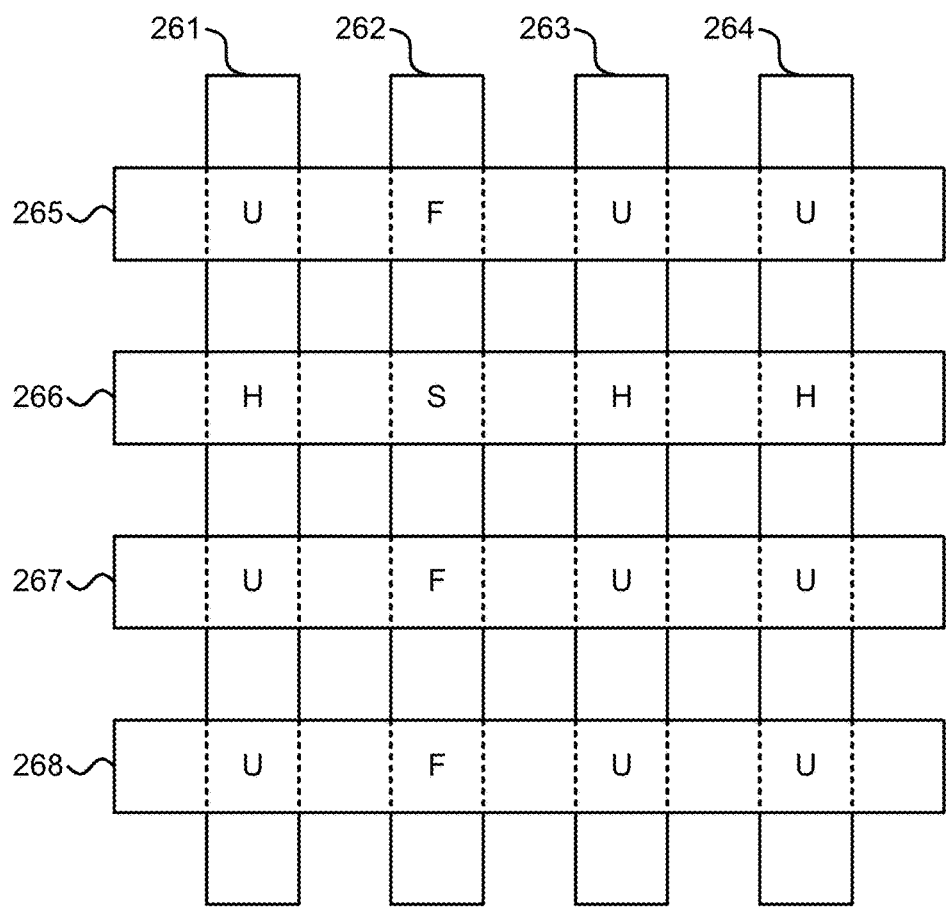

FIG. 2C depicts one embodiment of a cross-point memory array 260. In one example, the cross-point memory array 260 may correspond with memory array 201 in FIG. 2A. As depicted, cross-point memory array 260 includes word lines 265-268 and bit lines 261-264. The bit line 261 may comprise a vertical bit line or horizontal bit line. Word line 266 comprises a selected word line and bit line 262 comprises a selected bit line. At the intersection of selected word line 266 and selected bit line 262 is a selected memory cell (an S cell). The voltage across the S cell is the difference between the selected word line voltage and the selected bit line voltage. Memory cells at the intersections of the selected word line 266 and the unselected bit lines 261, 263, and 264 comprise unselected memory cells (H cells). H cells are unselected memory cells that share a selected word line that is biased to the selected word line voltage. The voltage across the H cells is the difference between the selected word line voltage and the unselected bit line voltage. Memory cells at the intersections of the selected bit line 262 and the unselected word lines 265, 267, and 268 comprise unselected memory cells (F cells). F cells are unselected memory cells that share a selected bit line that is biased to a selected bit line voltage. The voltage across the F cells is the difference between the unselected word line voltage and the selected bit line voltage. Memory cells at the intersections of the unselected word lines 265, 267, and 268 and the unselected bit lines 261, 263, and 264 comprise unselected memory cells (U cells). The voltage across the U cells is the difference between the unselected word line voltage and the unselected bit line voltage.

The number of F cells is related to the length of the bit lines (or the number of memory cells connected to a bit line) while the number of H cells is related to the length of the word lines (or the number of memory cells connected to a word line). The number of U cells is related to the product of the word line length and the bit line length. In one embodiment, each memory cell sharing a particular word line, such as word line 265, may be associated with a particular page stored within the cross-point memory array 260.

Figure 2D:
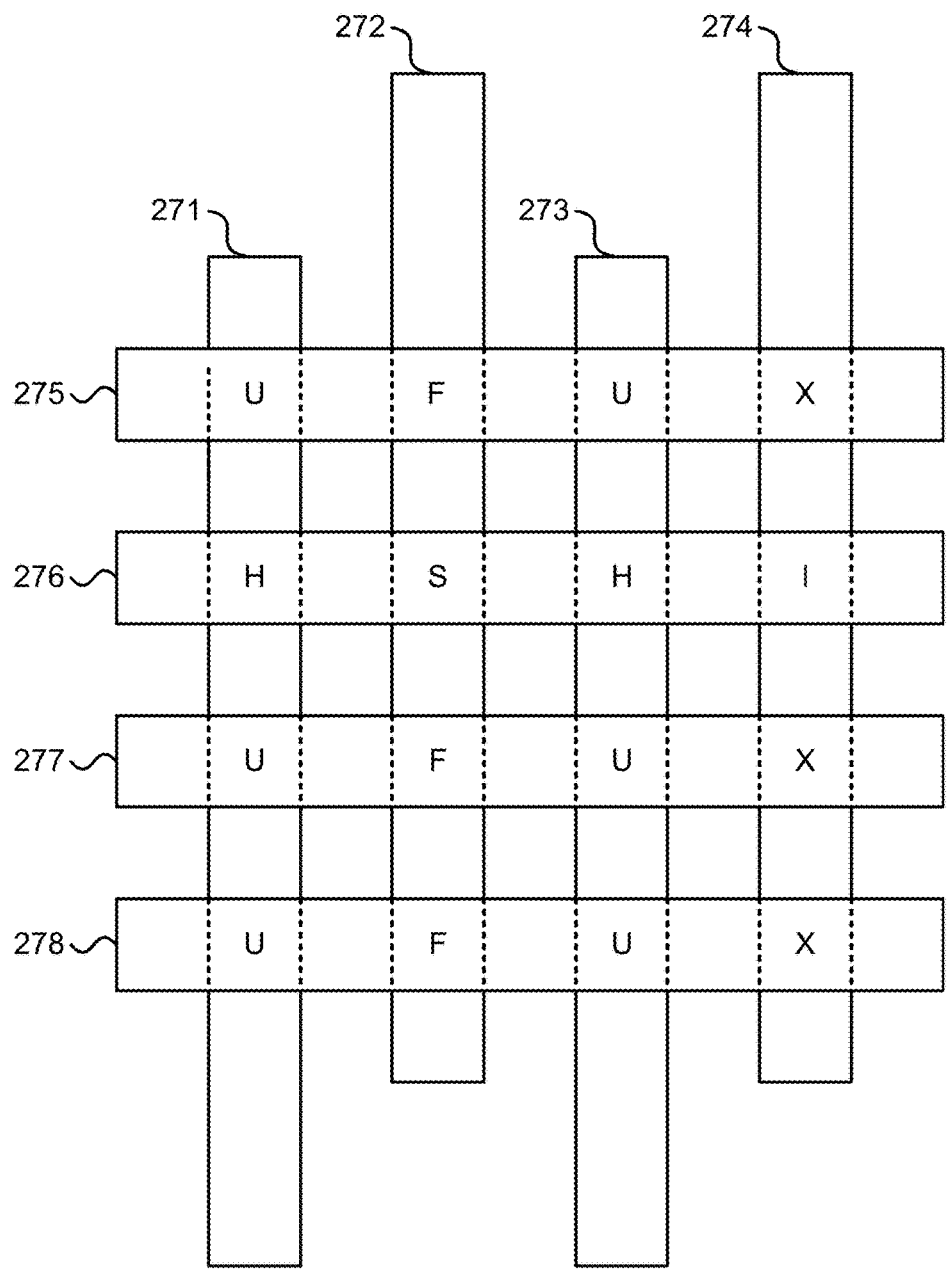

FIG. 2D depicts an alternative embodiment of a cross-point memory array 270. In one example, the cross-point memory array 270 may correspond with memory array 201 in FIG. 2A. As depicted, cross-point memory array 270 includes word lines 275-278 and bit lines 271-274. The bit line 271 may comprise a vertical bit line or horizontal bit line. Word line 276 comprises a selected word line and bit lines 272 and 274 comprise selected bit lines. Although both bit lines 272 and 274 are selected, the voltages applied to bit line 272 and bit line 274 may be different. For example, in the case that bit line 272 is associated with a first memory cell to be programmed (i.e., an S cell), then bit line 272 may be biased to a selected bit line voltage in order to program the first memory cell. In the case that bit line 274 is associated with a second memory cell that is not to be programmed (i.e., an I cell), then bit line 274 may be biased to a program inhibit voltage (i.e., to a bit line voltage that will prevent the second memory cell from being programmed).

At the intersection of selected word line 276 and selected bit line 274 is a program inhibited memory cell (an I cell). The voltage across the I cell is the difference between the selected word line voltage and the program inhibit voltage. Memory cells at the intersections of the selected bit line 274 and the unselected word lines 275, 277, and 278 comprise unselected memory cells (X cells). X cells are unselected memory cells that share a selected bit line that is biased to a program inhibit voltage. The voltage across the X cells is the difference between the unselected word line voltage and the program inhibit voltage. In one embodiment, the program inhibit voltage applied to the selected bit line 274 may be the same as or substantially the same as the unselected bit line voltage. In another embodiment, the program inhibit voltage may be a voltage that is greater than or less than the unselected bit line voltage. For example, the program inhibit voltage may be set to a voltage that is between the selected word line voltage and the unselected bit line voltage. In some cases, the program inhibit voltage applied may be a function of temperature. In one example, the program inhibit voltage may track the unselected bit line voltage over temperature.

In one embodiment, two or more pages may be associated with a particular word line. In one example, word line 275 may be associated with a first page and a second page. The first page may correspond with bit lines 271 and 273 and the second page may correspond with bit lines 272 and 274. In this case, the first page and the second page may correspond with interdigitated memory cells that share the same word line. When a memory array operation is being performed on the first page (e.g., a programming operation) and the selected word line 276 is biased to the selected word line voltage, one or more other pages also associated with the selected word line 276 may comprise H cells because the memory cells associated with the one or more other pages will share the same selected word line as the first page.

In some embodiments, not all unselected bit lines may be driven to an unselected bit line voltage. Instead, a number of unselected bit lines may be floated and indirectly biased via the unselected word lines. In this case, the memory cells of memory array 270 may comprise resistive memory elements without isolating diodes. In one embodiment, the bit lines 272 and 273 may comprise vertical bit lines in a three dimensional memory array comprising comb shaped word lines.

Figure 3A:
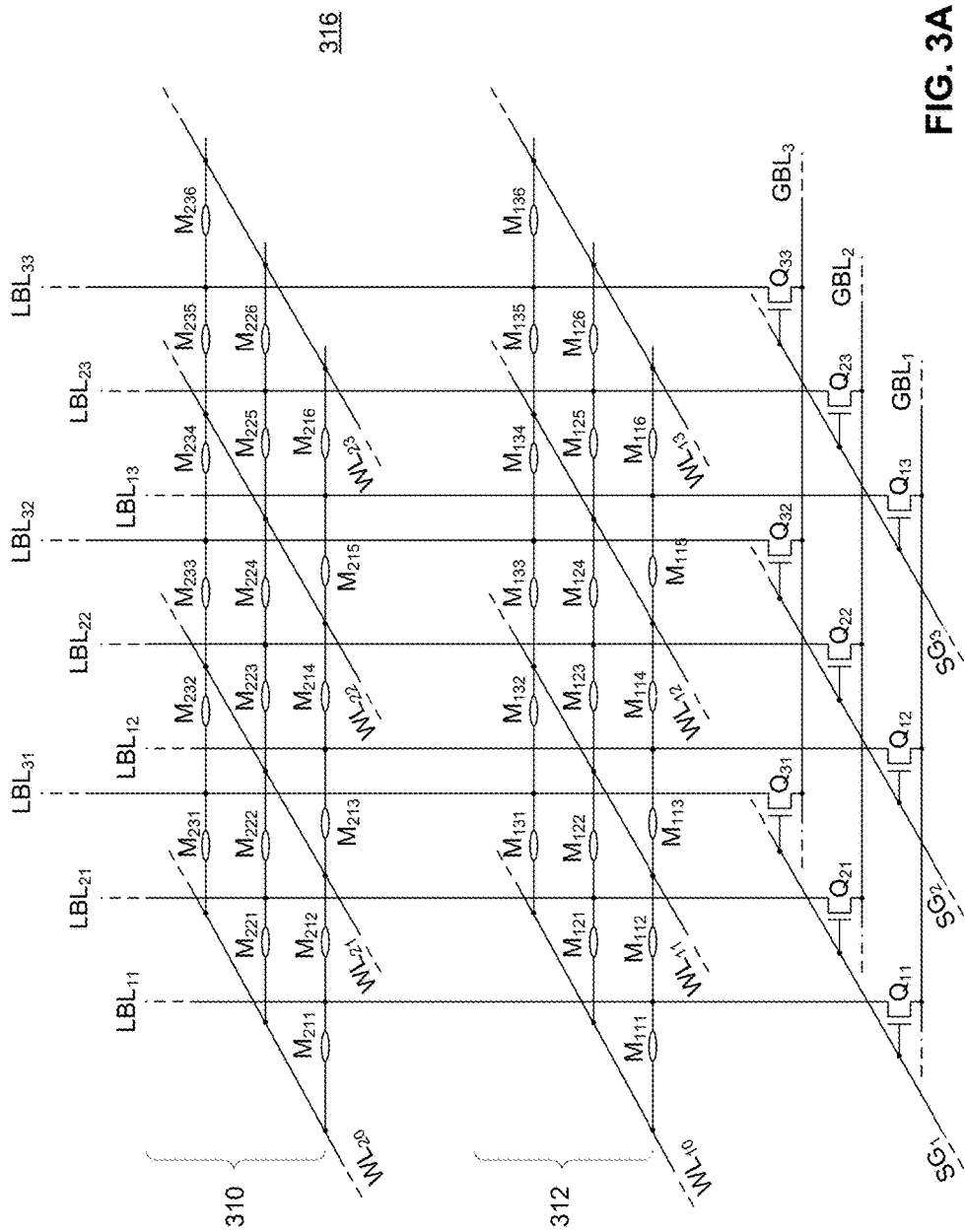

FIG. 3A depicts one embodiment of a portion of a monolithic three-dimensional memory array 316 that includes a first memory level 312 positioned below a second memory level 310. Memory array 316 is one example of an implementation for memory array 151 in FIG. 1E. As depicted, the local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $WL_{10}$). In one example, the particular memory cell may include a floating gate device or a charge trap device (e.g., using a silicon nitride material). In another example, the particular memory cell may include a reversible resistance-switching material, a metal oxide, a phase change material, or a ReRAM material. The global bit lines $GBL_1$-$GBL_3$ are arranged in a third direction that is perpendicular to both the first direction and the second direction. A set of bit line select devices (e.g., $Q_{11}$-$Q_{31}$) may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

Referring to FIG. 3A, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In one embodiment, a vertical bit line memory array, such as memory array 316, includes a greater number of memory cells along the word lines as compared with the number of memory cells along the vertical bit lines (e.g., the number of memory cells along a word line may be more than 10 times the number of memory cells along a bit line). In one example, the number of memory cells along each bit line may be 16 or 32, while the number of memory cells along each word line may be 2048 or more than 4096.

Figure 3B:
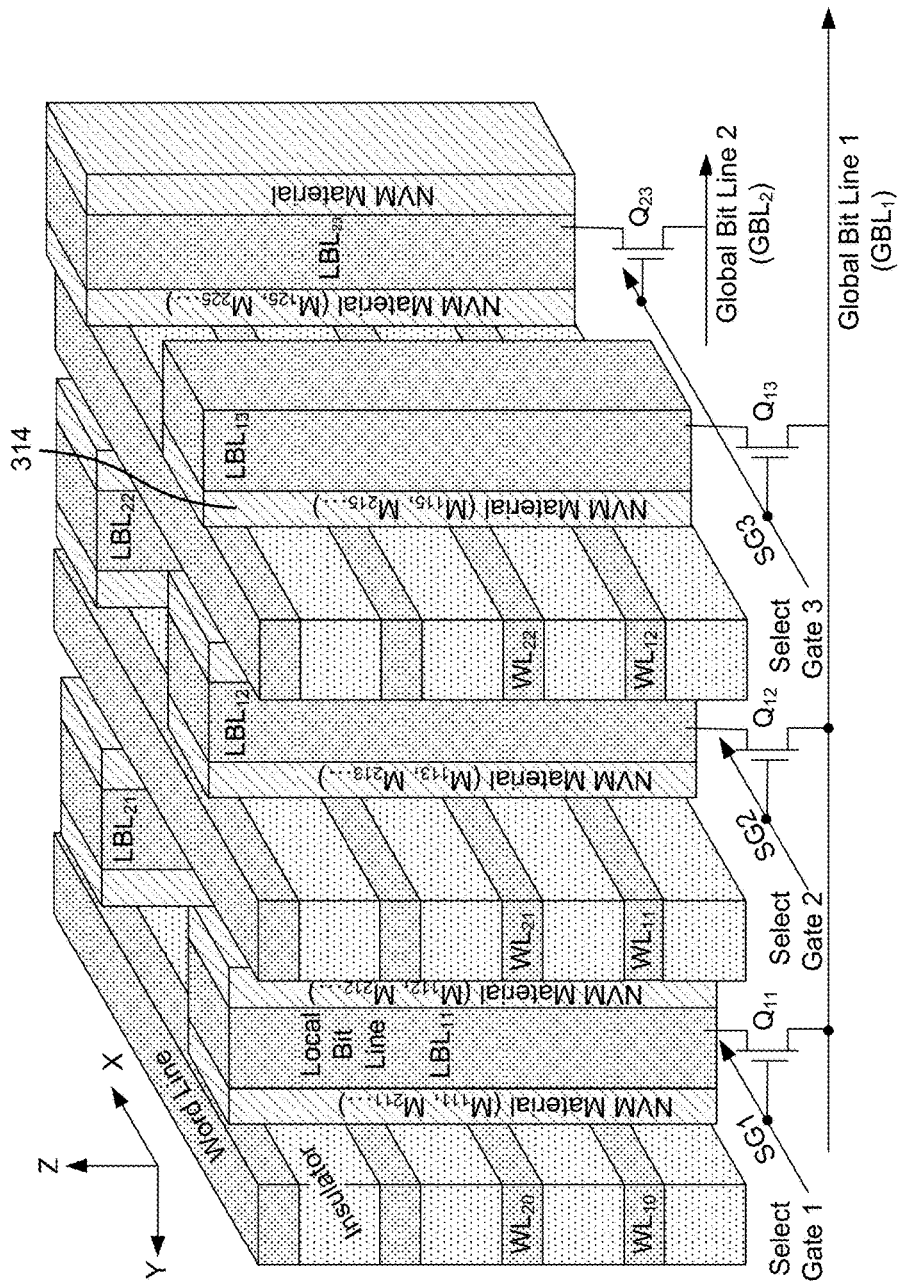

FIG. 3B depicts one embodiment of a portion of a monolithic three-dimensional memory array that includes vertical strips of a non-volatile memory material. The physical structure depicted in FIG. 3B may comprise one implementation for a portion of the monolithic three-dimensional memory array depicted in FIG. 3A. The vertical strips of non-volatile memory material may be formed in a direction that is perpendicular to a substrate (e.g., in the Z direction). A vertical strip of the non-volatile memory material 314 may include, for example, a vertical oxide layer, a vertical metal oxide layer (e.g., nickel oxide or hafnium oxide), a vertical layer of phase change material, or a vertical charge trapping layer (e.g., a layer of silicon nitride). The vertical strip of material may comprise a single continuous layer of material that may be used by a plurality of memory cells or devices. In one example, portions of the vertical strip of the non-volatile memory material 314 may comprise a part of a first memory cell associated with the cross section between $WL_{12}$ and $LBL_{13}$ and a part of a second memory cell associated with the cross section between $WL_{22}$ and $LBL_{13}$. In some cases, a vertical bit line, such as $LBL_{13}$, may comprise a vertical structure (e.g., a rectangular prism, a cylinder, or a pillar) and the non-volatile material may completely or partially surround the vertical structure (e.g., a conformal layer of phase change material surrounding the sides of the vertical structure). As depicted, each of the vertical bit lines may be connected to one of a set of global bit lines via a select transistor. The select transistor may comprise a MOS device (e.g., an NMOS device) or a vertical thin-film transistor (TFT).

FIG. 3C depicts a cross-sectional view of a memory structure using the vertically oriented select devices shown in FIG. 3B. The memory structure of FIG. 3C may comprise a continuous mesh array of memory elements because there are memory elements connected to both sides of the bit lines and memory elements connected to both sides of the word lines. At the bottom of FIG. 3C, a silicon substrate is depicted. Implemented above the surface of the silicon substrate are various metal lines including ML-0, ML-1, and ML-2. Line 526 of ML-2 serves as a respective global bit line (GBL). The Pillar Select Layer includes two oxide layers 520 with a gate material layer 522 sandwiched there between. The oxide layers 520 can be $SiO_2$. The metal line ML-2 526 serving as a global bit line can be implemented of any suitable material, including Tungsten, or Tungsten on a Titanium Nitride adhesion layer or a sandwich of n+ polysilicon on Tungsten on Titanium Nitride adhesion layer. Gate material 522 can be polysilicon, Titanium Nitride, Tantalum Nitride, Nickel Silicide or any other suitable material. Gate material 522 implements the row select lines $SG_x$ (e.g. $SG_1$, $SG_2$, . . . of FIG. 3B), which are labeled in FIG. 3C as row select lines 580, 582, 584, 586, 588 and 590.

The memory layer includes a set of vertical bit lines 530 (comprising N+ polysilicon). Interspersed between the vertical bit lines 530 are alternating oxide layers 534 and word line layers 536. In one embodiment, the word lines are made from TiN. Between the vertical bit lines 530 and the stacks of alternating oxide layers 536 and word line layers 536 are vertically oriented layers of reversible resistance switching material 532. In one embodiment the reversible resistance switching material is made of Hafnium Oxide $HfO_2$. In another embodiment, the reversible resistance switching material 532 may include a layer of amorphous silicon (e.g., a Si barrier layer) and a layer titanium oxide (e.g., a TiO2 switching layer). Box 540 depicts one example memory element which includes the reversible resistance switching material 532 sandwiched between a word line 536 and vertical bit line 530. Directly below each vertical bit line 530 are the vertically oriented select devices 504, each of which comprises (in one example embodiment) a n+/p−/n+ TFT. Each of the vertically oriented select devices 504 have oxide layers 505 on each side. FIG. 3C also shows an n+ polysilicon layer 524. As depicted, the npn TFT of vertically oriented select devices 504 can be used to connect the global bit line GBL (layer 526) with any of the vertical bit lines 530.

Moreover, FIG. 3C shows six row select lines ($SG_x$) 580, 582, 584, 586, 588 and 590 in the gate material layer 522, each underneath a stack of multiple word lines. Each of the row select lines 580, 582, 584, 586, 588 and 590 is positioned between two vertically oriented select devices 504, above and not in the substrate. Each row select line may serve as the gate signal to either of the two neighboring vertically oriented select devices 504; therefore, the vertically oriented select devices 504 are said to be double gated. Each vertically oriented select device 504 can be controlled by two different row select lines, in this embodiment. One aspect of the vertically oriented select devices incorporated to the base portion of each bit line pillar is that two adjacent vertically oriented select devices share the same gate region, which may allow the vertically oriented select devices to be closer together.

In some embodiments, a portion of a memory array may be formed by first etching through an alternating stack of word line layers and dielectric layers (e.g., etching through layers of TiN or polysilicon that are separated by oxide layers) to form a plurality of memory holes. The plurality of memory holes may comprise rectangular, square, or cylindrical holes. The plurality of memory holes may be formed by patterning and then removing material using various etching techniques such as dry etching, wet chemical etching, plasma etching, or reactive-ion etching (RIE). After the plurality of memory holes have been created, the layers for forming vertical pillars within the plurality of memory holes may be deposited. The layers of the vertical pillars may be deposited using various deposition techniques such as chemical vapor deposition (CVD), physical vapor deposition (PVD), or atomic layer deposition (ALD).

Figure 4:
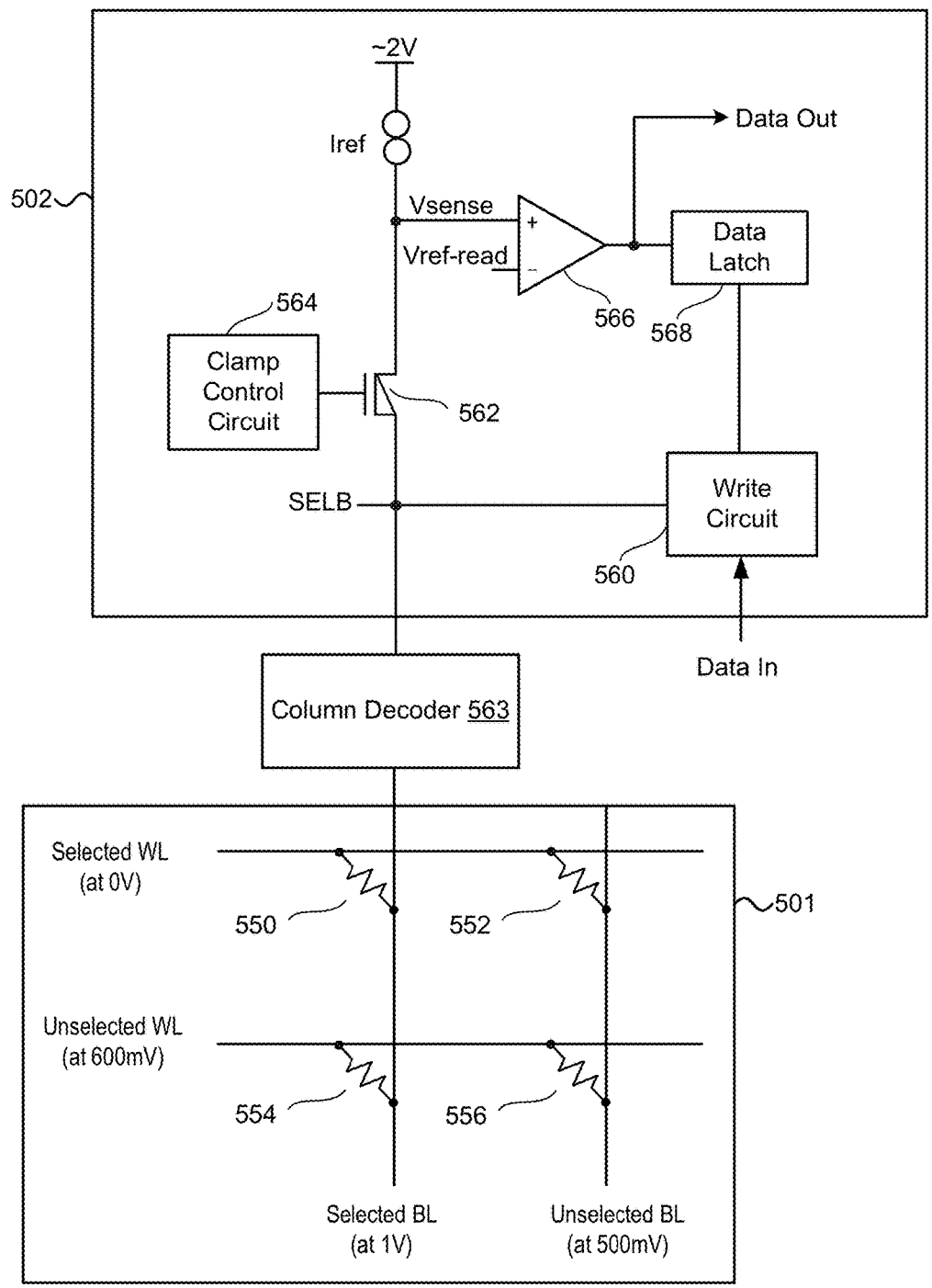
FIG. 4 depicts one embodiment of a read/write circuit.

FIG. 4 depicts one embodiment of a read/write circuit 502 along with a portion of a memory array 501. Read/write circuit 502 is one example of an implementation of read/write circuit 156 in FIG. 1D. The portion of a memory array 501 includes two of the many bit lines (one selected bit line labeled "Selected BL" and one unselected bit line labeled "Unselected BL") and two of the many word lines (one selected word line labeled "Selected WL" and one unselected word line labeled "Unselected WL"). The portion of a memory array also includes a selected memory cell 550 and unselected memory cells 552-556. In one embodiment, the portion of a memory array 501 may comprise a memory array with bit lines arranged in a direction horizontal to the substrate, such as memory array 201 in FIG. 2A. In another embodiment, the portion of a memory array 501 may comprise a memory array with bit lines arranged in a vertical direction that is perpendicular to the substrate, such as memory array 316 in FIG. 3A.

As depicted, during a memory array operation (e.g., a programming operation), the selected bit line may be biased to 1V, the unselected word line may be biased to 0.6V, the selected word line may be biased to 0V, and the unselected bit line may be biased to 0.5V. In some embodiments, during a second memory array operation, the selected bit line may be biased to a selected bit line voltage (e.g., 2.0V), the unselected word line may be biased to an unselected word line voltage (e.g., 1.0V), the selected word line may be biased to a selected word line voltage (e.g., 0V), and the unselected bit line may be biased to an unselected bit line voltage (e.g., 1V). In this case, the unselected memory cells sharing the selected word line will be biased to the voltage difference between the selected word line voltage and the unselected bit line voltage. In other embodiments, the memory array biasing scheme depicted in FIG. 4 may be reversed such that the selected bit line is biased to 0V, the unselected word line is biased to 0.4V, the selected word line is biased to 1V, and the unselected bit line is biased to 0.5V.

As depicted in FIG. 4, the SELB node of read/write circuit 502 may be electrically coupled to the selected bit line via column decoder 563. In one embodiment, column decoder 563 may correspond with column decoder 152 depicted in FIG. 1E. Transistor 562 couples (or electrically connects) node SELB to the Vsense node. The transistor 562 may comprise a low VT nMOS device. Clamp control circuit 564 controls the gate of transistor 562. The Vsense node is connected to reference current Iref and one input of sense amplifier 566. The other input of sense amplifier 566 receives Vref-read, which is the voltage level used for comparing the Vsense node voltage in read mode. The output of sense amplifier 566 is connected to the data out terminal and to data latch 568. Write circuit 560 is connected to node SELB, the Data In terminal, and data latch 568.

In one embodiment, during a read operation, read/write circuit 502 biases the selected bit line to the selected bit line voltage in read mode. Prior to sensing data, read/write circuit 502 will precharge the Vsense node to 2V (or some other voltage greater than the selected bit line voltage). When sensing data, read/write circuit 502 attempts to regulate the SELB node to the selected bit line voltage (e.g., 1V) via clamp control circuit 564 and transistor 562 in a source-follower configuration. If the current through the selected memory cell 550 is greater than the read current limit, Tref, then, over time, the Vsense node will fall below Vref-read (e.g., set to 1.5V) and the sense amplifier 566 will read out a data "0." Outputting a data "0" represents that the selected memory cell 550 is in a low resistance state (e.g., a SET state). If the current through the selected memory cell 550 is less than Iref, then the Vsense node will stay above Vref-read and the sense amplifier 566 will read out a data "1." Outputting a data "1" represents that the selected memory cell 550 is in a high resistance state (e.g., a RESET state). Data latch 568 may latch the output of sense amplifier 566 after a time period of sensing the current through the selected memory cell (e.g., after 400 ns).

In one embodiment, during a write operation, if the Data In terminal requests a data "0" to be written to a selected memory cell, then read/write circuit 502 may bias SELB to the selected bit line voltage for programming a data "0" in write mode (e.g., 1.2V for a SET operation) via write circuit 560. The duration of programming the memory cell may be a fixed time period (e.g., using a fixed-width programming pulse) or variable (e.g., using a write circuit 560 that senses whether a memory cell has been programmed while programming). If the Data In terminal requests a data "1" to be written, then read/write circuit 502 may bias SELB to the selected bit line voltage for programming a data "1" in write mode (e.g., 0V or −1.2V for a RESET operation) via write circuit 560. In some cases, if a selected memory cell is to maintain its current state, then the write circuit 560 may bias SELB to a program inhibit voltage during write mode. The program inhibit voltage may be the same as or close to the unselected bit line voltage.

Figure 5A:
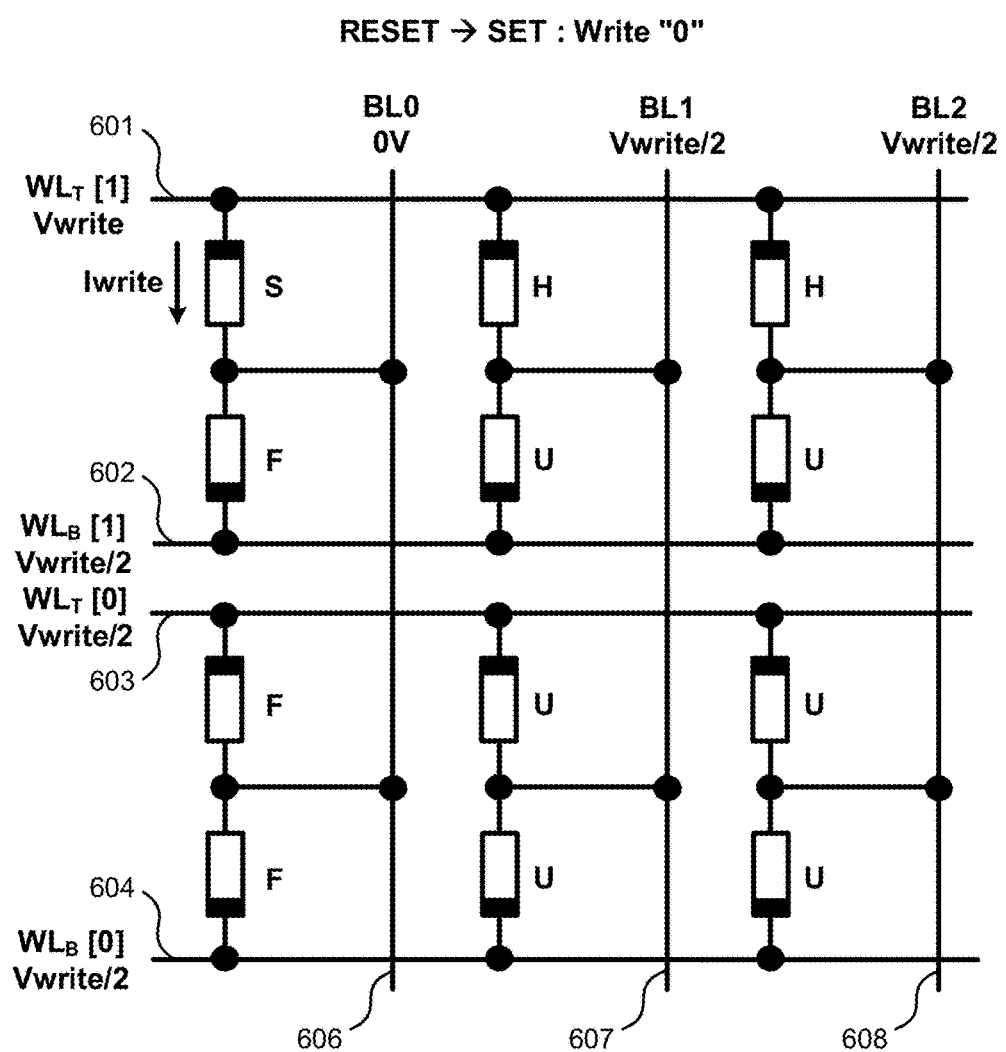
FIG. 5A depicts one embodiment of a portion of a memory array during a SET operation.

FIG. 5A depicts one embodiment of a portion of a memory array during a SET operation. The memory array includes a first word line 601, a second word line 602, a third word line 603, and a fourth word line 604. The memory array includes a first bit line 606, a second bit line 607, and a third bit line 608. As depicted, the selected first word line 601 and the selected first bit line 606 connect to a selected memory cell S. The selected first bit line 606 and the unselected word lines 602-604 connect to unselected memory cells (F cells). The selected first word line 601 and the unselected bit lines 607-608 connect to unselected memory cells (H cells). The unselected word lines 602-604 and the unselected bit lines 607-608 connect to unselected memory cells (U cells). During a memory operation (e.g., a write operation), the selected first word line 601 may be set to a write voltage Vwrite (e.g., 3V), the selected first bit line 606 may be set to the selected bit line voltage during a SET operation (e.g., 0V), and the unselected word lines 602-604 and the unselected bit lines 607-608 may be set to the write voltage divided by two (e.g., 1.5V). In this case, due to the control line bias conditions, the selected memory cell S may be SET from a high resistance state to a low resistance state, while all the unselected memory cells (e.g., the H, F, and U cells) remain in their previous resistance state.

Figure 5B:
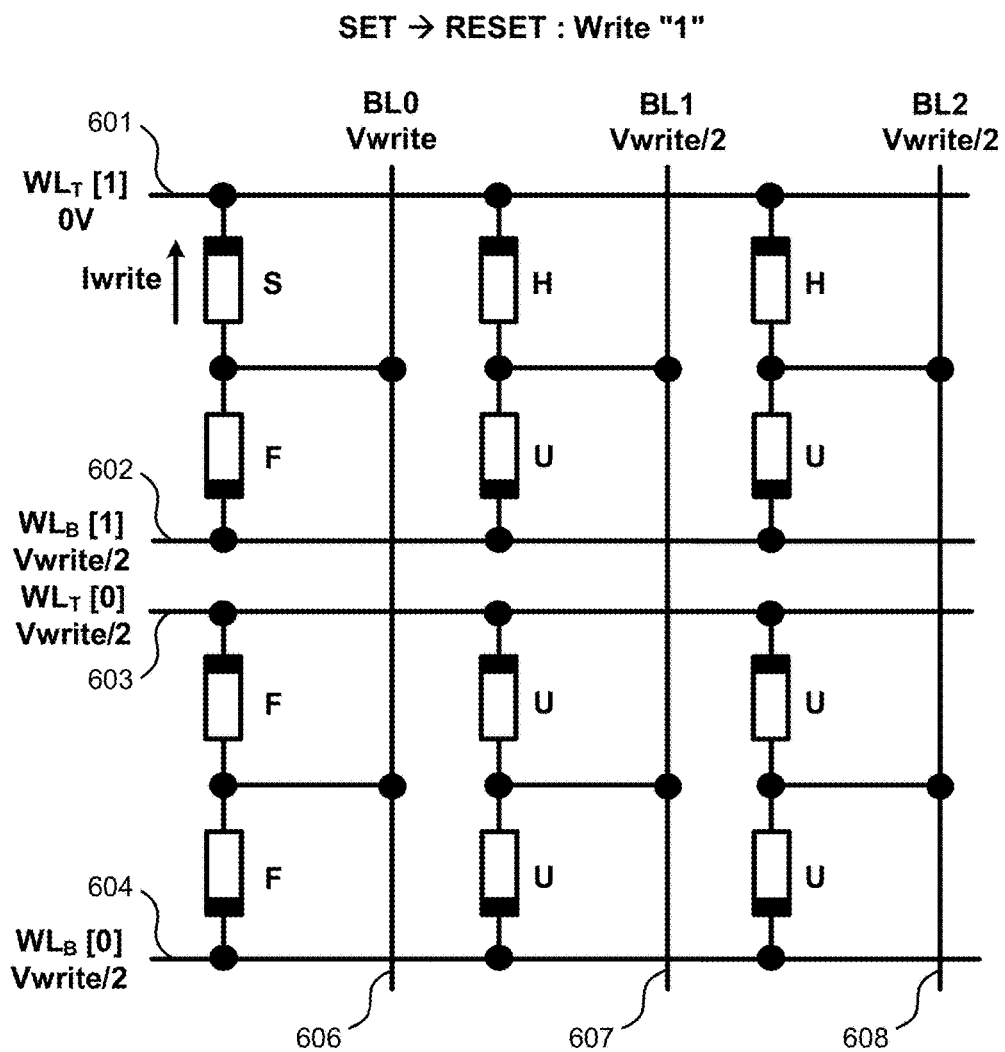
FIG. 5B depicts one embodiment of a portion of a memory array during a RESET operation.

FIG. 5B depicts one embodiment of a portion of a memory array during a RESET operation. As depicted, during the memory operation, the unselected word lines 602-604 and the unselected bit lines 607-608 are set to the write voltage divided by two (Vwrite/2), the selected first word line 601 is set to the selected word line voltage during a RESET operation (e.g., 0V), and the selected first bit line 606 is set to the write voltage Vwrite (e.g., 3V). In this case, due to the control line bias conditions, the selected memory cell S may be RESET from a low resistance state to a high resistance state, while all the unselected memory cells (e.g., the H, F, and U cells) remain in the same resistance state. In the embodiments depicted in FIGS. 5A-5B, only a single selected word line per memory array is selected during the memory operation.

Figure 6A:
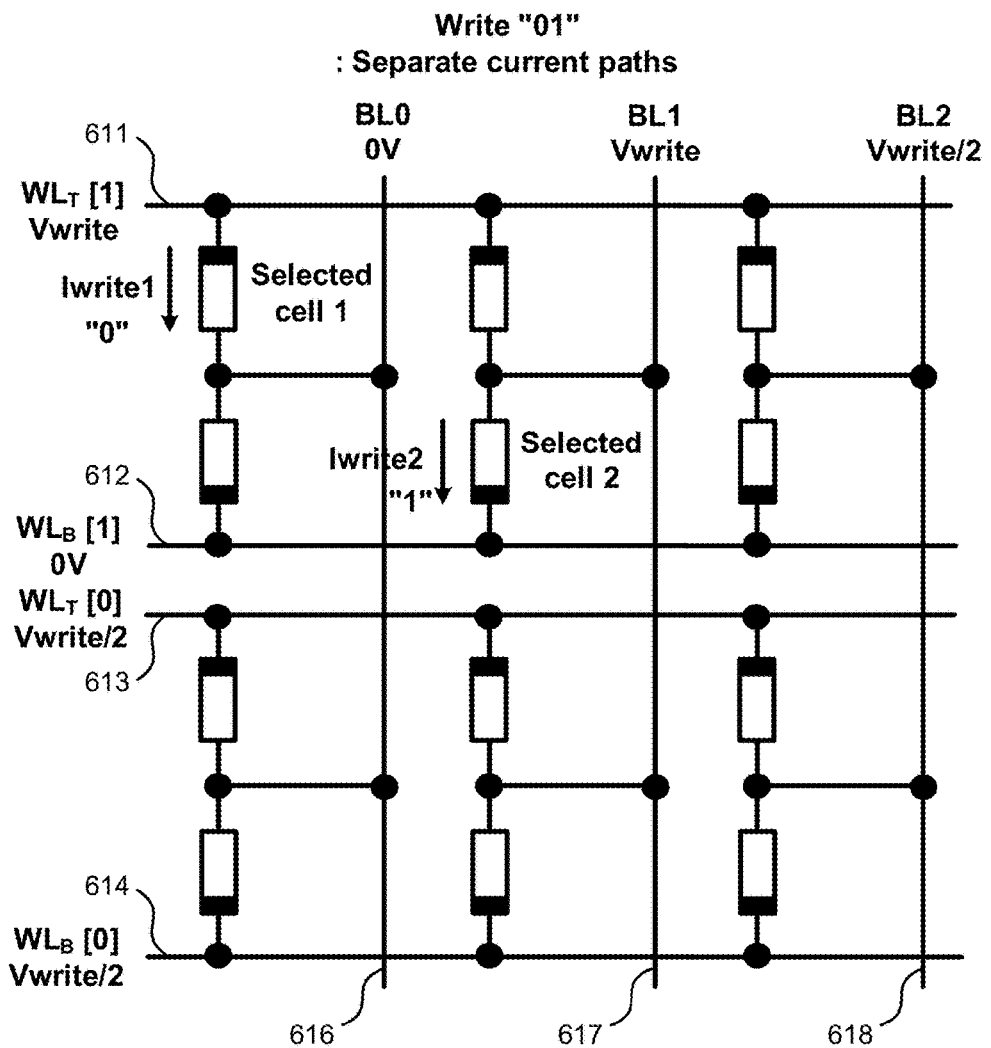
FIG. 6A depicts one embodiment of a portion of a memory array during a memory operation in which two different selected word line voltages are applied to two different word lines within the memory array.

FIG. 6A depicts one embodiment of a portion of a memory array during a memory operation in which two different selected word line voltages are applied to two different word lines within the memory array. The memory array includes a first word line 611, a second word line 612, a third word line 613, and a fourth word line 614. The memory array includes a first bit line 616, a second bit line 617, and a third bit line 618. As depicted, during the memory operation, a first selected word line comprising the first word line 611 is set to a first selected word line voltage (e.g., Vwrite or 3V) for a SET operation, a second selected word line comprising the second word line 612 is set to a second selected word line voltage (e.g., 0V) for a RESET operation, and the unselected word lines 613-614 are set to an unselected word line voltage (e.g., to the write voltage divided by two or 1.5V). During the memory operation, a first selected bit line comprising the first bit line 616 is set to a first selected bit line voltage (e.g., 0V) for a SET operation, a second selected bit line comprising the second bit line 617 is set to a second selected bit line voltage (e.g., Vwrite or 3V) for a RESET operation, and the unselected bit line 618 is set to an unselected bit line voltage (e.g., to the write voltage divided by two or 1.5V). In this case, a first selected memory cell connected to the first word line 611 and the first bit line 616 may be SET while a second selected memory cell connected to the second word line 612 and the second bit line 617 is RESET.

The SET operation may correspond with writing a data "0" to the first selected memory cell. The RESET operation may correspond with writing a data "1" to the second selected memory cell. In the memory operation depicted in FIG. 6A, a positive voltage (e.g., +3V) substantially equal to the first selected word line voltage minus the first selected bit line voltage may be placed across the first memory cell causing the first memory cell to be SET while a negative voltage (e.g., −3V) substantially equal to the second selected word line voltage minus the second selected bit line voltage is placed across the second memory cell causing the second memory cell to be RESET.

As the write current Iwrite1 through the first selected memory cell takes a separate word line and bit line current path than the write current Iwrite2 through the second selected memory cell, any IR drops along the first word line 611 and the first bit line 616 due to the write current Iwrite1 will not affect the IR drops along the second word line 612 and the second bit line 617. Therefore, the first selected memory cell may be SET while the second selected memory cell is RESET without the SET and RESET operations interfering with each other or causing variability in the IR drops along the selected word lines and the selected bit lines.

In some cases, the first selected memory cell and the second selected memory cell may be positioned on adjacent or neighboring word lines (e.g., on word lines WL3 and WL4) and/or on adjacent or neighboring bit lines (e.g., on bit lines BL5 and BL6). In other cases, the first selected memory cell and the second selected memory cell may be positioned on non-adjacent or non-neighboring word lines (e.g., on word lines WL3 and WL42) and/or on non-adjacent or non-neighboring bit lines (e.g., on bit lines BL5 and BL26).

In one embodiment, the memory array depicted in FIG. 6A may comprise a two layer memory array with a top layer of memory cells arranged above a bottom layer of memory cells. A first set of memory cells on the top layer may be connected to the first word line 611 and a second set of memory cells on the top layer may be connected to the third word line 613. A first set of memory cells on the bottom layer may be connected to the second word line 612 and a second set of memory cells on the bottom layer may be connected to the fourth word line 614. The first set of memory cells on the top layer may be arranged above the first set of memory cells on the bottom layer. Similarly, the second set of memory cells on the top layer may be arranged above the second set of memory cells on the bottom layer.

Figure 6B:
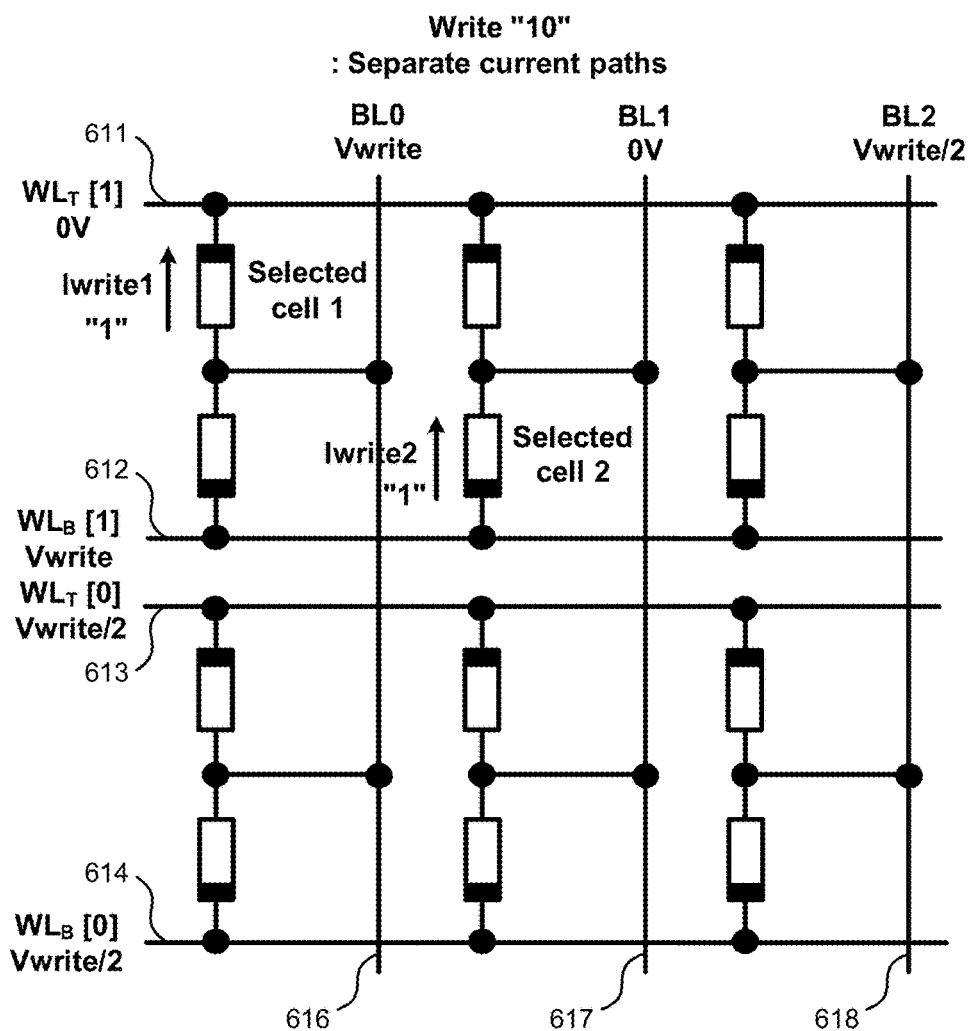
FIG. 6B depicts one embodiment of the portion of the memory array depicted in FIG. 6A during a second memory operation in which two different selected word line voltages are applied to two different word lines within the memory array.

FIG. 6B depicts one embodiment of the portion of the memory array depicted in FIG. 6A during a second memory operation in which two different selected word line voltages are applied to two different word lines within the memory array. As depicted, during the second memory operation, a first selected word line comprising the first word line 611 is set to a first selected word line voltage (e.g., 0V) for a RESET operation, a second selected word line comprising the second word line 612 is set to a second selected word line voltage (e.g., Vwrite or 3V) for a SET operation, and the unselected word lines 613-614 are set to an unselected word line voltage (e.g., Vwrite divided by two or 1.5V). During the second memory operation, a first selected bit line comprising the first bit line 616 is set to a first selected bit line voltage (e.g., Vwrite or 3V) for a RESET operation, a second selected bit line comprising the second bit line 617 is set to a second selected bit line voltage (e.g., 0V) for a SET operation, and the unselected bit line 618 is set to an unselected bit line voltage (e.g., to the write voltage divided by two or 1.5V). In this case, a first selected memory cell connected to the first word line 611 and the first bit line 616 may be RESET while a second selected memory cell connected to the second word line 612 and the second bit line 617 is SET.

In the second memory operation depicted in FIG. 6B, a negative voltage (e.g., −3V) substantially equal to the first selected word line voltage minus the first selected bit line voltage may be placed across the first memory cell causing the first memory cell to be RESET while a positive voltage (e.g., +3V) substantially equal to the second selected word line voltage minus the second selected bit line voltage is placed across the second memory cell causing the second memory cell to be SET. Similar to the memory operation depicted in FIG. 6A, as the write current Iwrite1 through the first selected memory cell takes a separate word line and bit line current path compared to the write current Iwrite2 through the second selected memory cell, any IR drops along the first word line 611 and the first bit line 616 due to the write current Iwrite1 will not affect the IR drops along the second word line 612 and the second bit line 617. Therefore, the first selected memory cell may be RESET while the second selected memory cell is SET without the SET and RESET operations interfering with each other or causing variability in the IR drops along the selected word lines and the selected bit lines.

In one embodiment, the memory array depicted in FIG. 6B may comprise a two layer memory array with a top layer of memory cells arranged above a bottom layer of memory cells. A first set of memory cells on the top layer may be connected to the first word line 611 and a second set of memory cells on the top layer may be connected to the third word line 613. A first set of memory cells on the bottom layer may be connected to the second word line 612 and a second set of memory cells on the bottom layer may be connected to the fourth word line 614. The first set of memory cells on the top layer may be arranged above the first set of memory cells on the bottom layer. Similarly, the second set of memory cells on the top layer may be arranged above the second set of memory cells on the bottom layer.

Figure 6C:
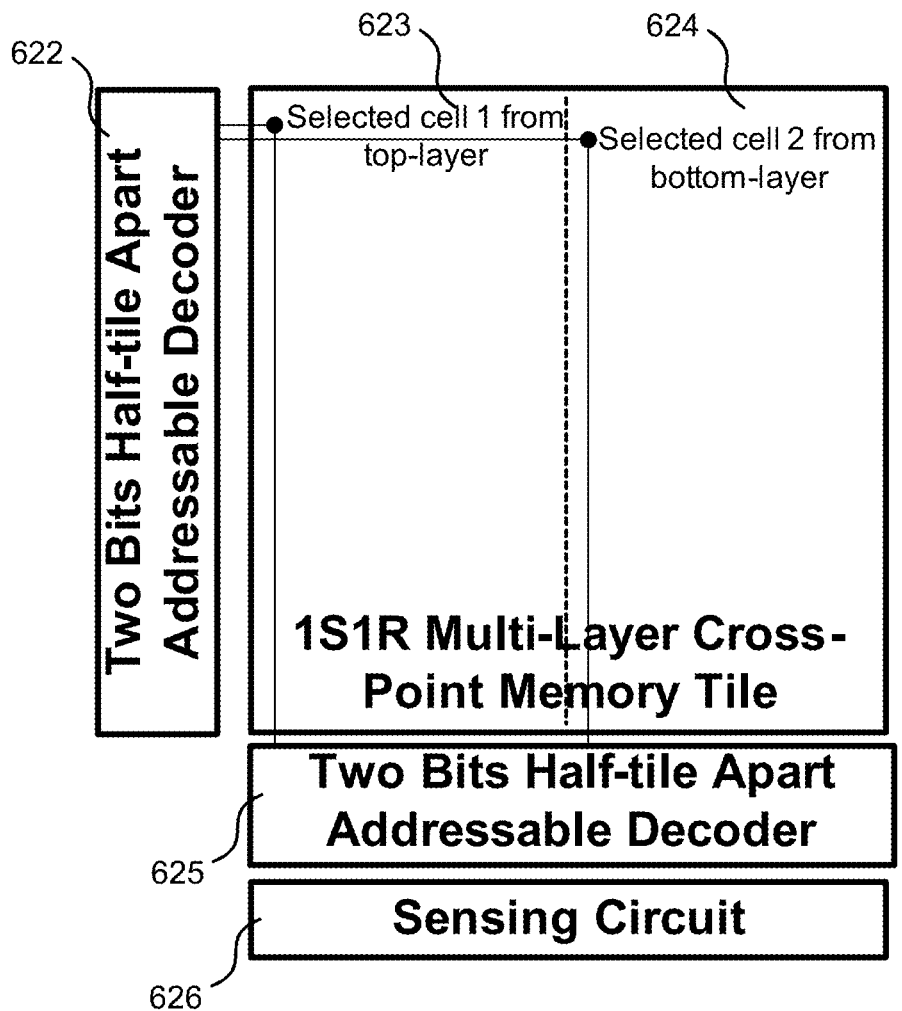
FIG. 6C depicts one embodiment of a memory array in which one or more memory cells along a first word line may be SET while one or more other memory cells along a second word line may be RESET.

FIG. 6C depicts one embodiment of a memory array in which one or more memory cells along a first word line may be SET while one or more other memory cells along a second word line may be RESET. As depicted, the memory array comprises a first portion 623 of the memory array and a second portion 624 of the memory array. In one example, the first portion 623 of the memory array may comprise a left half portion of the memory array and the second portion 624 of the memory array may comprise a right half portion of the memory array. A word line decoder 622 may select both a first word line connected to the one or more memory cells to be SET (or RESET) and a second word line connected to the one or more other memory cells to be RESET (or SET). The word line decoder 622 may set the unselected word lines (e.g., all the word lines other than the first word line and the second word line) to an unselected word line voltage. The word line decoder 622 may comprise a plurality of last stage word line decoders (e.g., a last stage word line decoder per word line driven) or a plurality of word line drivers for each of the word lines in the memory array. In one example, a first word line driver of the word line decoder 622 may drive the first word line and a second word line driver of the word line decoder 622 may drive the second word line. The word line decoder 622 in FIG. 6C may comprise a representative example of means for setting a word line of a memory array to a selected word line voltage. In some cases, the word line decoder 622 in FIG. 6C may comprise a representative example of means for setting a first word line of a memory array to a first selected word line voltage while setting a second word line of the memory array to a second selected word line voltage. The word line decoder 622 in FIG. 6C may comprise a representative example of means for setting a first word line of a memory array to a first selected word line voltage, means for setting a second word line of the memory array to a second selected word line voltage, and means for setting a third word line of the memory array to an unselected voltage.

A bit line decoder 625 may select both a first set of bit lines connected to the one or more memory cells to be SET (or RESET) and a second set of bits lines connected to the one or more other memory cells to be RESET (or SET). The bit line decoder 625 may set the unselected bit lines (e.g., all the bit lines other than the first set of bit lines and the second set of bit lines) to an unselected bit line voltage. The bit line decoder 625 may comprise a plurality of last stage bit line decoders (e.g., a last stage bit line decoder per bit line driven or per set of bit lines driven) or a plurality of bit line drivers for each of the bit lines in the memory array. In one example, a first bit line driver of the bit line decoder 625 may drive a first bit line within the memory array and a second bit line driver of the bit line decoder 625 may drive a second bit line within the memory array. The bit line decoder 625 in FIG. 6C may comprise a representative example of means for setting a bit line of a memory array to either a selected bit line voltage or to an unselected bit line voltage.

In one embodiment, the bit line decoder 625 may select a first memory cell within the first portion 623 of the memory array to be SET while selecting a second memory cell within the second portion 624 of the memory array to be RESET. The sensing circuit 626 (e.g., comprising one or more sense amplifiers) may be used to verify the SET and RESET operations and/or detect when the SET and RESET operations have successfully programmed the one or more memory cells to be in a low resistance state and the one or more other memory cells to be in a high resistance state greater than the low resistance state. One benefit of SETTING a first memory cell within the first portion 623 of the memory array while RESETTING a second memory cell with the second portion 624 of the memory array is that program disturb may be reduced due to interference between the two memory cells. In one example, the memory array may comprise 2K word lines and 2K bit lines.

In some cases, a first selected word line within the memory array may have a first programming pulse applied to the first selected word line while a second programming pulse is applied to a second selected word line within the memory array. The first programming pulse may comprise a first voltage waveform and the second programming pulse may comprise a second voltage waveform different from the first voltage waveform. In one example, the first programming pulse may correspond with a first pulse width and the second programming pulse may correspond with a second pulse width different from the first pulse width. The first pulse width may be greater than the second pulse width. In some cases, the pulse width corresponding with a RESET operation may be greater than the pulse width corresponding with a SET operation. In other cases, the pulse width corresponding with a RESET operation may be less than the pulse width corresponding with a SET operation. The determination of the first pulse width or the magnitude of the first programming pulse may be made based on the type of memory operation to be performed (e.g., whether a SET or RESET operation is to be performed) and/or a temperature of the memory array (e.g., determined using an on-die temperature sensor).

Figure 7:
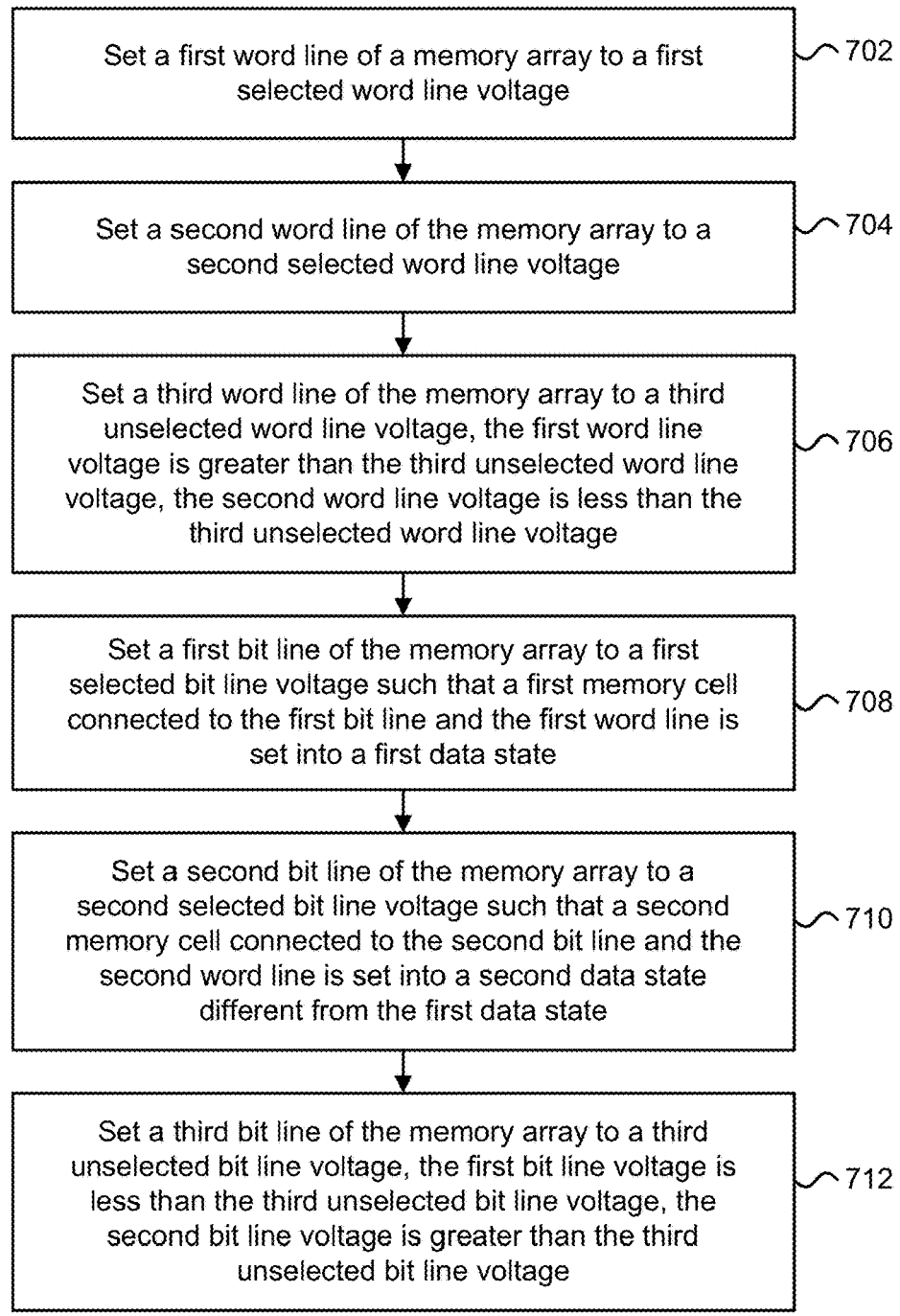
FIG. 7 is a flowchart describing one embodiment of a process for performing a memory operation in which two different selected word line voltages are applied to two different word lines within a memory array.

FIG. 7 is a flowchart describing one embodiment of a process for performing a memory operation in which two different selected word line voltages are applied to two different word lines within a memory array. In one embodiment, the process of FIG. 7 may be performed using control circuitry, such as the memory core control circuits 104 in FIG. 1A and/or the word line and bit line decoders in FIG. 6C.

In step 702, a first word line of a memory array is set to a first selected word line voltage. In step 704, a second word line of the memory array is set to a second selected word line voltage. The memory array may comprise a cross-point memory array or a 3D ReRAM memory array. The memory cells within the memory array may comprise ReRAM memory cells, MRAM memory cells, or phase change memory cells. The first selected word line voltage may correspond with a SET operation and the second selected word line voltage may correspond with a RESET operation.

In step 706, a third word line of the memory array is set to a third unselected word line voltage. In some cases, the first word line voltage may be greater than the third unselected word line voltage. The second word line voltage may be less than the third unselected word line voltage. In step 708, a first bit line of the memory array is set to a first selected bit line voltage such that a first memory cell connected to the first bit line and the first word line is set into a first data state or a first resistance state. In one example, the first memory cell may be SET into a low resistance state. In another example, the first memory cell may be RESET into a high resistance state. In step 710, a second bit line of the memory array is set to a second selected bit line voltage such that a second memory cell connected to the second bit line and the second word line is set into a second data state different from the first data state or is set into a second resistance state different from the first resistance state. In one example, the second memory cell may be SET into a low resistance state while the first memory cell is RESET into a high resistance state. In another example, the second memory cell may be RESET into a high resistance state while the first memory cell is SET into a low resistance state. In step 712, the third bit line of the memory array is set to a third unselected bit line voltage. In some cases, the first bit line voltage may be less than the third unselected bit line voltage and the second bit line voltage may be greater than the third unselected bit line voltage.

The steps depicted the process of FIG. 7 may be performed by word line and bit line biasing circuitry and the biasing of the word lines and bit line within the memory array may be performed in any order. In one example, the word lines (e.g., the first word line and the second word line) may be biased or set to their respective selected word line voltages before the bit lines (e.g., the first bit line and the second bit line) are biased or set to their respective selected bit line voltages. In another example, the word lines may be biased or set to their respective selected word line voltages at the same time as or concurrent with the bit lines being biased or set to their respective selected bit line voltages.

In one embodiment, during a portion of the memory operation, the first word line is set to the first selected word line voltage, the second word line is set to the second selected word line voltage, the first bit line is set to the first selected bit line voltage, and the second bit line is set to the second selected bit line voltage such that the first memory cell is SET while the second memory cell is RESET. In some cases, the first word line and the second word line may be biased to their respective selected word line voltages before the first bit line and the second bit line are biased to their respective selected bit line voltages. In one example, the memory operation may coincide with a first period of time and a second period of time and the first word line and the second word line may be biased to their respective selected word line voltages during the first period of time and the first bit line and the second bit line may be biased to their respective selected bit line voltages during the second period of time subsequent to the first period of time. In other embodiments, the first word line and the first bit line may be biased to their selected control line voltages during a first period of time and the second word line and the second bit line may be biased to their selected control line voltages during a second period of time subsequent to the first period of time.

One embodiment of the disclosed technology includes a memory array including a first memory cell and a second memory cell, a first word line driver configured to drive a first word line of the memory array to a first selected word line voltage during a memory operation, a second word line driver configured to drive a second word line of the memory array to a second selected word line voltage different from the first selected word line voltage during the memory operation, a first bit line driver configured to drive a first bit line of the memory array to a first selected bit line voltage during the memory operation, and a second bit line driver configured to drive a second bit line of the memory array to a second selected bit line voltage different from the first selected bit line voltage during the memory operation. The second memory cell is connected to both the second word line and the second bit line. The first memory cell is connected to both the first word line and the first bit line.

One embodiment of the disclosed technology includes a memory array including a first memory cell and a second memory cell and one or more control circuits in communication with the memory array. The one or more control circuits configured to set a first word line of the memory array to a first selected word line voltage and set a second word line of the memory array to a second selected word line voltage different from the first selected word line voltage during a memory operation. In some cases, the memory operation may comprise a combination of SET and RESET operations. The one or more control circuits configured to set a first bit line of the memory array to a first selected bit line voltage during the memory operation such that the first memory cell connected to the first bit line and the first word line is set into a first resistance state. The one or more control circuits configured to set a second bit line of the memory array to a second selected bit line voltage during the memory operation such that the second memory cell connected to the second bit line and the second word line is set into a second resistance state different from the first resistance state.

One embodiment of the disclosed technology includes means for setting a first word line of a memory array to a first selected word line voltage, means for setting a second word line of the memory array to a second selected word line voltage, means for setting a first bit line of the memory array to a first selected bit line voltage such that a first memory cell connected to the first bit line and the first word line is set into a first resistance state during a first period of time, and means for setting a second bit line of the memory array to a second selected bit line voltage such that a second memory cell connected to the second bit line and the second word line is set into a second resistance state different from the first resistance state during the first period of time.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
a memory array including a first memory cell and a second memory cell;
a first word line driver drives a first word line of the memory array to a first selected word line voltage;
a second word line driver drives a second word line of the memory array to a second selected word line voltage different from the first selected word line voltage;
a first bit line driver drives a first bit line of the memory array to a first selected bit line voltage while the first word line is set to the first selected word line voltage and while the second word line is set to the second selected word line voltage, the first memory cell is connected to the first word line and the first bit line; and
a second bit line driver drives a second bit line of the memory array to a second selected bit line voltage different from the first selected bit line voltage while the first word line is set to the first selected word line voltage and while the second word line is set to the second selected word line voltage, the second memory cell is connected to the second word line and the second bit line.

2. The apparatus of claim 1, wherein:
the first bit line of the memory array is set to the first selected bit line voltage such that the first memory cell is set into a first resistance state; and
the second bit line of the memory array is set to the second selected bit line voltage such that the second memory cell is set into a second resistance state different from the first resistance state.

3. The apparatus of claim 1, wherein:
the first memory cell is SET while the second memory cell is RESET.

4. The apparatus of claim 1, further comprising:
a third word line driver drives a third word line of the memory array to an unselected word line voltage while the first word line is set to the first selected word line voltage and while the second word line is set to the second selected word line voltage; and
a third bit line driver drives a third bit line of the memory array to an unselected bit line voltage while the first word line is set to the first selected word line voltage and while the second word line is set to the second selected word line voltage, the memory array includes a third memory cell connected to the third word line and the third bit line.

5. The apparatus of claim 4, wherein:
the first selected word line voltage is greater than the unselected word line voltage and the second selected word line voltage is less than the unselected word line voltage.

6. The apparatus of claim 4, wherein:
the first selected bit line voltage is less than the unselected bit line voltage and the second selected bit line voltage is greater than the unselected bit line voltage.

7. The apparatus of claim 1, wherein:
the memory array comprises a first layer of memory cells arranged above a second layer of memory cells, the first layer of memory cells includes the first memory cell and the second layer of memory cells includes the second memory cell.

8. The apparatus of claim 1, wherein:
the first bit line and the second bit line are non-adjacent bit lines.

9. The apparatus of claim 1, wherein:
the first word line driver applies a first voltage waveform to the first word line; and
the second word line driver applies a second voltage waveform different from the first voltage waveform to the second word line.

10. The apparatus of claim 9, wherein:
the first voltage waveform comprises a first voltage pulse of a first pulse width and the second voltage waveform comprises a second voltage pulse of a second pulse width greater than the first pulse width.

11. The apparatus of claim 9, wherein:
the first voltage waveform comprises a first voltage pulse of a first magnitude and the second voltage waveform comprises a second voltage pulse of a second magnitude less than the first magnitude.

12. A system, comprising:
means for setting a first word line of a memory array to a first selected word line voltage;
means for setting a second word line of the memory array to a second selected word line voltage;

means for setting a first bit line of the memory array to a first selected bit line voltage such that a first memory cell connected to the first bit line and the first word line is set into a first resistance state during a first period of time; and means for setting a second bit line of the memory array to a second selected bit line voltage such that a second memory cell connected to the second bit line and the second word line is set into a second resistance state different from the first resistance state during the first period of time, the first bit line of the memory array is set to the first selected bit line voltage while the second bit line of the memory array is set to the second selected bit line voltage.

13. The system of claim 12, further comprising:

means for setting a third word line of the memory array to an unselected word line voltage, the first selected word line voltage is greater than the unselected word line voltage and the second selected word line voltage is less than the unselected word line voltage; and means for setting a third bit line of the memory array to an unselected bit line voltage, the first selected bit line voltage is less than the unselected bit line voltage and the second selected bit line voltage is greater than the unselected bit line voltage.

14. The system of claim 13, wherein:
the first memory cell is SET during the first period of time while the second memory cell is RESET.

15. An apparatus, comprising:
a memory array including a first memory cell and a second memory cell;
a first word line driver sets a first word line of the memory array to a first selected word line voltage;
a second word line driver sets a second word line of the memory array to a second selected word line voltage different from the first selected word line voltage;
a first bit line driver sets a first bit line of the memory array to a first selected bit line voltage while the first word line is set to the first selected word line voltage and while the second word line is set to the second selected word line voltage, the first memory cell is connected to the first word line and the first bit line; and
a second bit line driver sets a second bit line of the memory array to a second selected bit line voltage different from the first selected bit line voltage while the first word line is set to the first selected word line voltage and while the second word line is set to the second selected word line voltage, the second memory cell is connected to the second word line and the second bit line.

16. The apparatus of claim 15, wherein:
the first bit line of the memory array is set to the first selected bit line voltage such that the first memory cell is set into a first resistance state; and
the second bit line of the memory array is set to the second selected bit line voltage such that the second memory cell is set into a second resistance state different from the first resistance state.

17. The apparatus of claim 15, wherein:
the first memory cell is SET while the second memory cell is RESET.

18. The apparatus of claim 15, further comprising:
a third word line driver sets a third word line of the memory array to an unselected word line voltage while the first word line is set to the first selected word line voltage and while the second word line is set to the second selected word line voltage; and
a third bit line driver sets a third bit line of the memory array to an unselected bit line voltage while the first word line is set to the first selected word line voltage and while the second word line is set to the second selected word line voltage, the memory array includes a third memory cell connected to the third word line and the third bit line.

19. The apparatus of claim 18, wherein:
the first selected word line voltage is greater than the unselected word line voltage and the second selected word line voltage is less than the unselected word line voltage.

20. The apparatus of claim 18, wherein:
the first selected bit line voltage is less than the unselected bit line voltage and the second selected bit line voltage is greater than the unselected bit line voltage.

21. The apparatus of claim 15, wherein:
the memory array comprises a first layer of memory cells arranged below a second layer of memory cells, the first layer of memory cells includes the first memory cell and the second layer of memory cells includes the second memory cell.

22. The apparatus of claim 15, wherein:
the first bit line and the second bit line are adjacent bit lines.

23. The apparatus of claim 15, wherein:
the first word line driver applies a first voltage waveform to the first word line; and
the second word line driver applies a second voltage waveform different from the first voltage waveform to the second word line.

24. The apparatus of claim 23, wherein:
the first voltage waveform comprises a first voltage pulse of a first pulse width and the second voltage waveform comprises a second voltage pulse of a second pulse width greater than the first pulse width.

25. The apparatus of claim 23, wherein:
the first voltage waveform comprises a first voltage pulse of a first magnitude and the second voltage waveform comprises a second voltage pulse of a second magnitude less than the first magnitude.

* * * * *